(12) United States Patent
Yamazaki et al.

(10) Patent No.: US 8,546,161 B2
(45) Date of Patent: Oct. 1, 2013

(54) MANUFACTURING METHOD OF THIN FILM TRANSISTOR AND LIQUID CRYSTAL DISPLAY DEVICE

(75) Inventors: Shunpei Yamazaki, Tokyo (JP); Jun Koyama, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 198 days.

(21) Appl. No.: 13/226,822

(22) Filed: Sep. 7, 2011

(65) Prior Publication Data

US 2012/0064650 A1 Mar. 15, 2012

(30) Foreign Application Priority Data

Sep. 13, 2010 (JP) ................................. 2010-204599

(51) Int. Cl.
*H01L 21/00* (2006.01)
(52) U.S. Cl.
USPC ...................... 438/30; 438/158; 257/E21.414
(58) Field of Classification Search
USPC ............................... 438/30, 22, 34, 158, 159
See application file for complete search history.

(56) References Cited

U.S. PATENT DOCUMENTS

| | | | |
|---|---|---|---|
| 5,477,355 A | 12/1995 | Sasaki et al. | |
| 5,731,856 A | 3/1998 | Kim et al. | |
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

EP 1 737 044 A1 12/2006
EP 2 226 847 A2 9/2010

(Continued)

OTHER PUBLICATIONS

Toshio Kamiya et al.; "Carrier transport properties and electronic structures of amorphous oxide semiconductors: the present status"; Solid State Physics; Kotai Butsuri; Sep. 1, 2009; pp. 621-633.; vol. 44, No. 9 (English abstract).

(Continued)

*Primary Examiner* — Charles Garber
*Assistant Examiner* — Reema Patel
(74) *Attorney, Agent, or Firm* — Fish & Richardson P.C.

(57) ABSTRACT

Etching of a semiconductor layer including a part over a gate wiring and formation of a contact hole for connection between a pixel electrode and a drain electrode are performed by one-time photolithography step and one-time etching step; thus, the number of photolithography steps is reduced. The exposed part of the gate wiring is covered by an insulating layer, and this insulating layer also functions as a spacer for maintaining a space for a liquid crystal layer. By the reduction in the number of photolithography steps, a liquid crystal display device can be provided at lower cost and higher productivity. Using an oxide semiconductor for the semiconductor layer can realize a liquid crystal display device with low power consumption and high reliability.

21 Claims, 16 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163865 A1 | 7/2010 | Arai |
| 2011/0084265 A1 | 4/2011 | Arasawa et al. |
| 2011/0085104 A1 | 4/2011 | Arasawa et al. |
| 2012/0052625 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kamiya, T et al., "Carrier Transport Properties and Electronic Structures of Amorphous Oxide Semiconductors: The present status," Solid State Physics, Sep. 1, 2009, vol. 44, No. 9, pp. 621-633, Agne Gijutsu Center with full English translation.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al.. "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350°C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park. J et al., "Amorphous Indium-Gallium-Zinc Oxide TFTs and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

FIG. 4A1
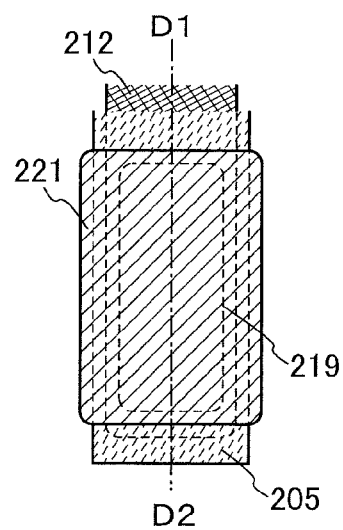
FIG. 4A2
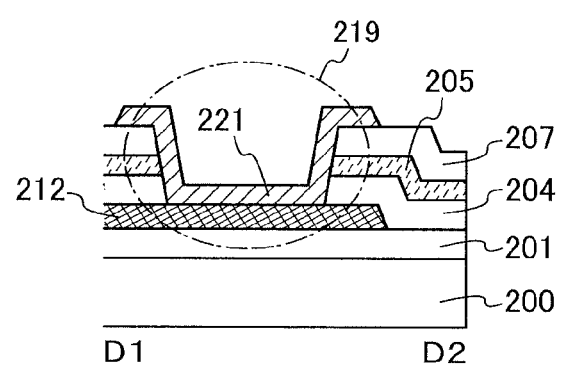
FIG. 4B1
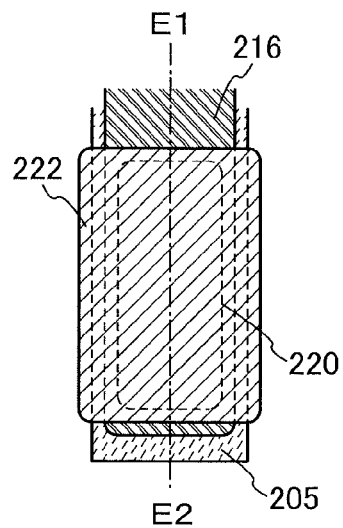
FIG. 4B2
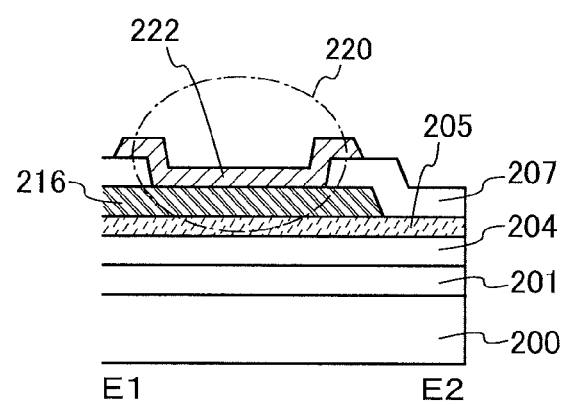

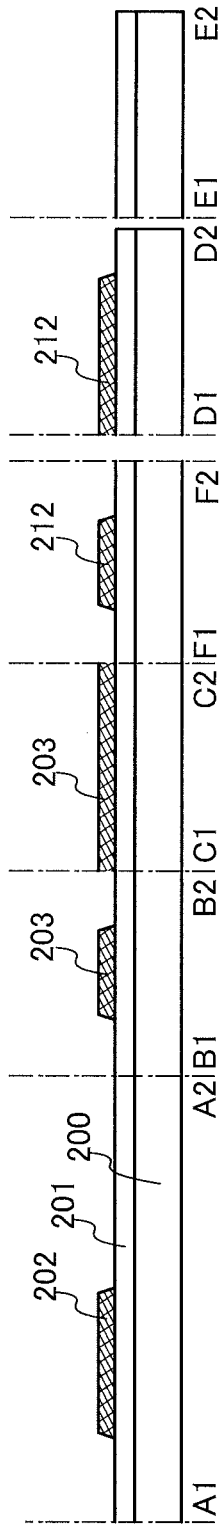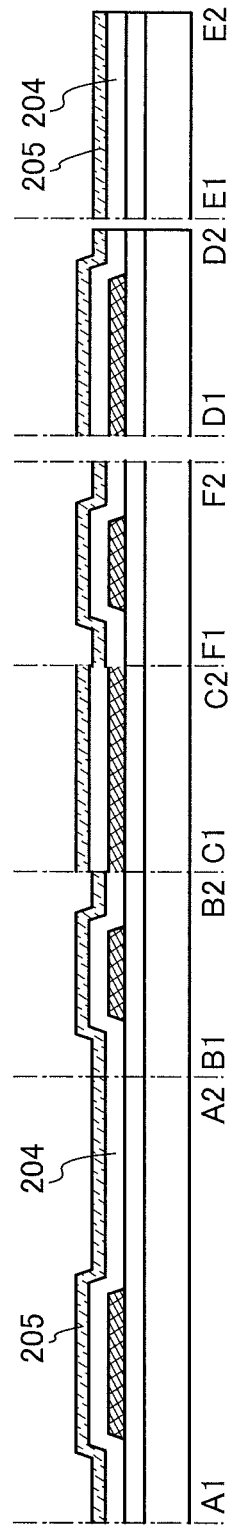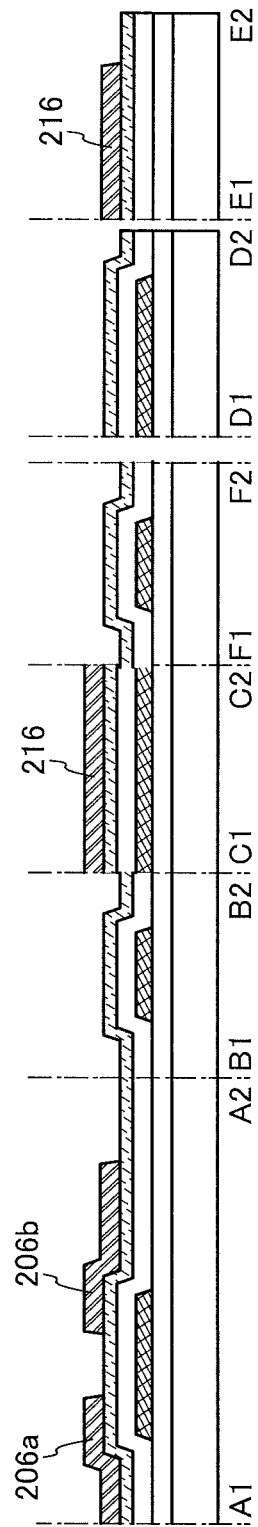

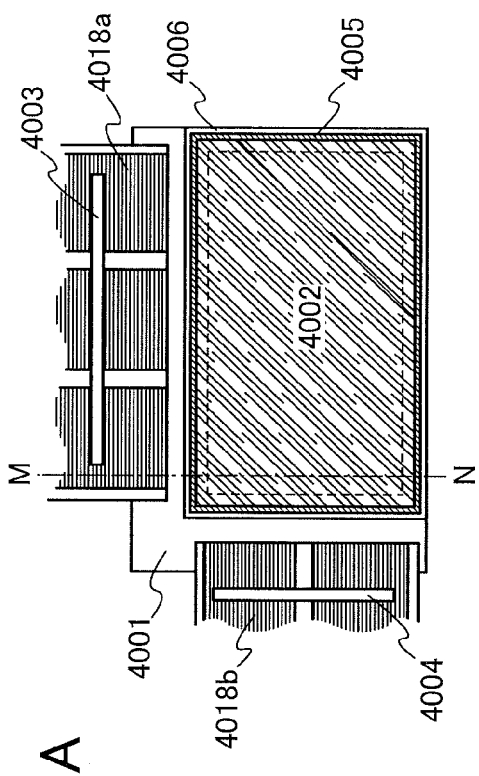
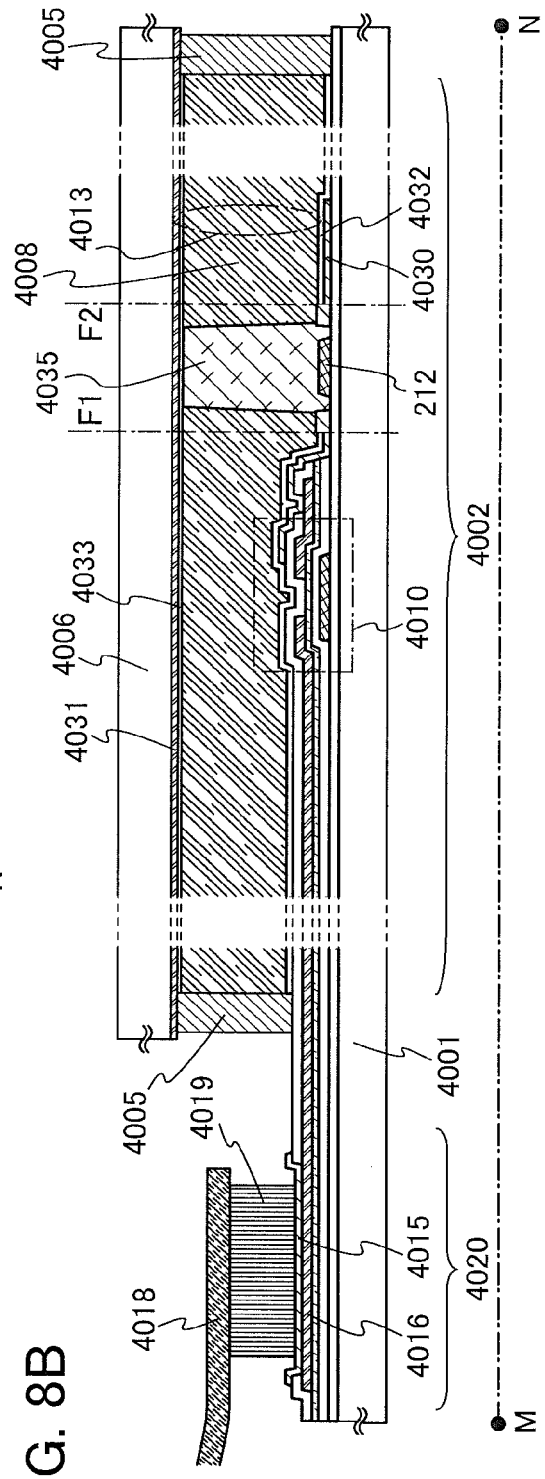
FIG. 8A
FIG. 8B

FIG. 11A
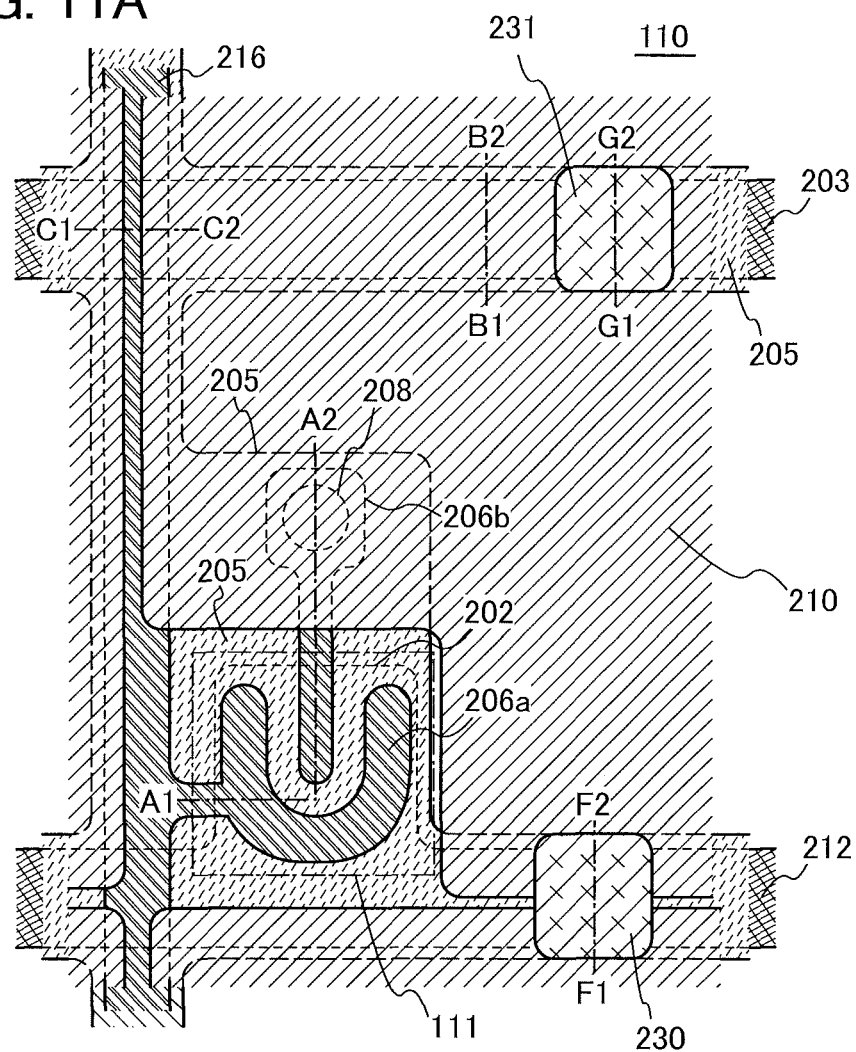
FIG. 11B  FIG. 11C  FIG. 11D  FIG. 11E
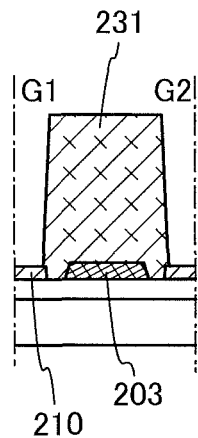 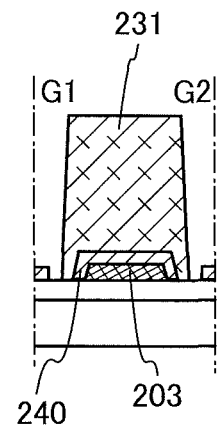 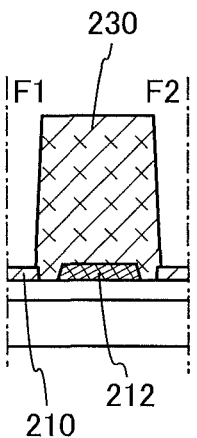 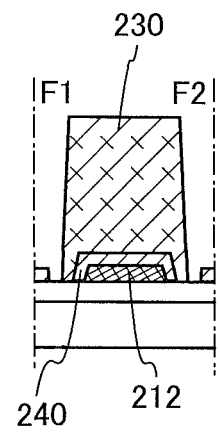

● In
○ Sn
○ Zn
• O

● In
○ Ga
○ Zn
● O

- In
- Ga or Zn
- O

- In
- Ga
- Zn
- O

MANUFACTURING METHOD OF THIN FILM TRANSISTOR AND LIQUID CRYSTAL DISPLAY DEVICE

BACKGROUND OF THE INVENTION

1. Field of the Invention

The present invention relates to a manufacturing method of a thin film transistor and a manufacturing method of a liquid crystal display device.

In this specification, a semiconductor device means all types of devices that can function by utilizing semiconductor characteristics, and a semiconductor circuit, a memory device, an imaging device, a display device, an electro-optical device, an electronic device, and the like are all semiconductor devices.

2. Description of the Related Art

In recent years, thin film transistors that are formed using a semiconductor thin film having a thickness of approximately several nanometers to several hundreds of nanometers over a substrate having an insulating surface such as a glass substrate have been attracting attentions. Thin film transistors are widely used for electronic devices such as ICs (integrated circuits) and electro-optical devices. In particular, thin film transistors are urgently developed as switching elements of image display devices typified by liquid crystal display devices and the like. In an active matrix liquid crystal display device, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The range of uses of such an active matrix liquid crystal display device is expanding, and demands for larger screen size, higher definition, and higher aperture ratio are increasing. In addition, it is demanded that the active matrix liquid crystal display device has high reliability and that a production method of the active matrix liquid crystal display device offers high yield and reduces production cost. Simplification of a process is one way for increasing productivity and reducing production cost.

In active matrix liquid crystal display devices, thin film transistors are mainly used as switching elements. In manufacturing thin film transistors, reduction in the number of photolithography steps or simplification of the photolithography step is important for simplification of the whole process. For example, when one photolithography step is added, the following steps are further needed: resist application, prebaking, light exposure, development, postbaking, and the like and, moreover, steps before and after the aforementioned steps, such as film formation, etching, resist removal, cleaning, drying, and the like. Thus, the number of steps is significantly increased only by adding one photolithography step in the manufacturing process. Therefore, many techniques for reducing the number of photolithography steps or simplifying the photolithography step in a manufacturing process have been developed.

Thin film transistors are broadly classified into top-gate thin film transistors, in which a channel formation region is provided below a gate electrode, and bottom-gate thin film transistors, in which a channel formation region is provided above a gate electrode. These thin film transistors are generally manufactured using at least five photomasks.

Many conventional techniques for simplifying the photolithography step use a complicated technique such as backside light exposure, resist reflow, or a lift-off method, which requires a special apparatus in many cases. Using such complicated techniques may cause various problems, thereby leading to reduction in yield. Moreover, there has often been no option but to sacrifice electrical characteristics of thin film transistors.

As typical means for simplifying the photolithography step in a manufacturing process of a thin film transistor, a technique using a multi-tone mask (called a half-tone mask or a gray-tone mask) is widely known. As a technique for reducing the number of manufacturing steps by using a multi-tone mask, Patent Document 1 can be, for example, given.

REFERENCE

Patent Document

[Patent Document 1] Japanese Published Patent Application No. 2003-179069

SUMMARY OF THE INVENTION

An object of one embodiment of the present invention is to reduce the number of photolithography steps used for manufacturing a thin film transistor to less than the conventional manufacturing method.

An object of one embodiment of the present invention is to reduce the number of photomasks used for manufacturing a display device including a thin film transistor to less than the conventional manufacturing method.

Further, an object is to provide a liquid crystal display device with reduced power consumption.

Furthermore, an object is to provide a liquid crystal display device with high reliability.

Etching of a semiconductor layer and formation of a contact hole are performed by one photolithography step. By a photolithography step for forming an island-shaped semiconductor layer, a contact hole for connection between a pixel electrode and a drain electrode is formed. At this time, part of the semiconductor layer, which is located over a gate wiring between transistors, is removed so that the semiconductor layer is divided by the removed part, and in addition, a gate insulating layer under the removed part is removed. Over the gate wiring that is exposed through the steps, an insulating layer is formed to cover the gate wiring. This insulating layer also functions as a spacer for maintaining a space that is to be filled with a liquid crystal. In this manner, the gate wiring can be protected against corrosion.

One embodiment of the present invention includes a step of forming a plurality of transistors, which includes the steps of forming gate electrodes and a gate wiring over a substrate by a first photolithography step, forming a gate insulating layer over the gate electrodes, forming a semiconductor layer over the gate insulating layer, and forming source electrodes and drain electrodes over the semiconductor layer by a second photolithography step; a step of forming an insulating layer over the source electrodes and the drain electrodes; a step of forming contact holes by selectively removing parts of the insulating layer, which overlap with the drain electrodes, and removing a part of the insulating layer, a part of the semiconductor layer, and a part of the gate insulating layer, which overlap with neither the source electrodes nor the drain electrodes, by a third photolithography step; and a step of forming pixel electrodes over the insulating layer by a fourth photolithography step. The third photolithography step includes a step of exposing a part of the gate wiring positioned between the plurality of transistors to divide the semiconductor layer. The fourth photolithography step is performed so that the pixel electrodes are electrically disconnected from the exposed gate wiring. An insulating layer serving as a spacer for maintaining a space that is to be filled with a liquid crystal is formed over the exposed gate wiring.

An insulating layer having a function of preventing diffusion of an impurity element from the substrate may be provided between the substrate and the gate electrode.

For the third photolithography step, either dry etching or wet etching or a combination of dry etching and wet etching can be used.

When the gate electrodes, the source electrodes, the drain electrodes, or a wiring connected to such electrodes are formed of a material containing copper or aluminum, wiring resistance can be reduced and thus signal delay can be prevented.

Using an oxide semiconductor for the semiconductor layer can realize a liquid crystal display device with low power consumption and high reliability.

Note that an oxide semiconductor (purified OS) that is purified by reduction of impurities such as moisture or hydrogen serving as an electron donor (donor) is an intrinsic (i-type) semiconductor or a substantially i-type semiconductor. Therefore, a transistor including the oxide semiconductor has a characteristic of very small off-state current. Specifically, the concentration of hydrogen in the purified oxide semiconductor which is measured by secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$. In addition, the carrier density of the oxide semiconductor, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. With the use of a purified oxide semiconductor with sufficiently reduced concentration of impurities such as moisture or hydrogen, the off-state current of the transistor can be reduced.

The analysis of the hydrogen concentration in the oxide semiconductor by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a mountain-shaped peak having a maximum value and a valley-shaped peak having a minimum value do not exist in the region where the film is provided, the value of the inflection point is employed as the hydrogen concentration.

According to one embodiment of the present invention, the number of manufacturing steps of a liquid crystal display device can be significantly reduced; accordingly, a liquid crystal display device can be provided at low cost with high productivity.

A liquid crystal display device with low power consumption and high reliability can be provided.

BRIEF DESCRIPTION OF THE DRAWINGS

In the accompanying drawings:

FIGS. 4A1 and 4B1 and FIGS. 4A2 and 4B2 are plan views and cross-sectional views, respectively, of one embodiment of the present invention;

FIGS. 5A to 5C are cross-sectional process views of one embodiment of the present invention;

FIGS. 8A and 8B are a plan view and a cross-sectional view, respectively, of one embodiment of the present invention;

FIGS. 11A to 11E are a plan view and cross-sectional views of one embodiment of the present invention;

DETAILED DESCRIPTION OF THE INVENTION

Figure 1A:
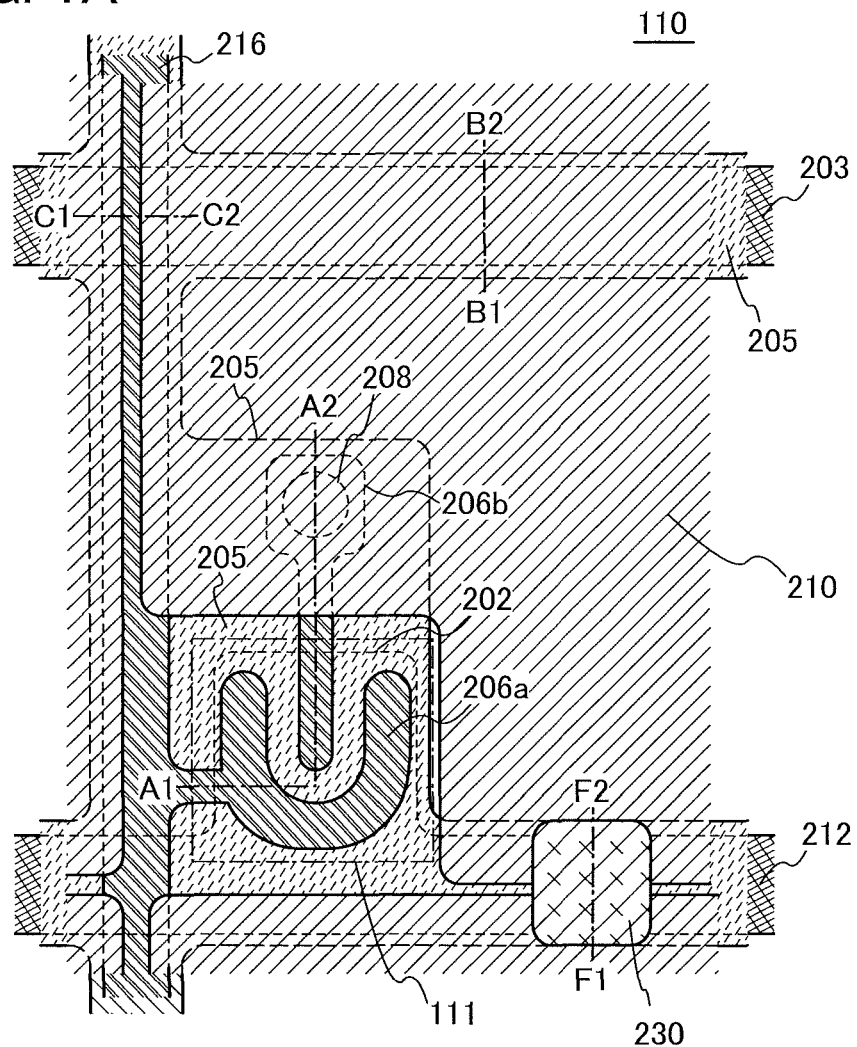
FIGS. 1A and 1B are a plan view and a cross-sectional view, respectively, of one embodiment of the present invention.

Hereinafter, embodiments of the present invention will be described with reference to the drawings. Note that the present invention is not limited to the following description, and it will be readily appreciated by those skilled in the art that the mode and details can be changed in various different ways without departing from the spirit and the scope of the present invention. Therefore, the present invention should not be construed as being limited to the following description of the embodiments. Note that in the structures of the present invention which are described below, the same reference numerals are commonly used to denote the same components or components having similar functions among different drawings, and description of such components is not repeated.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings" formed in an integrated manner.

Embodiment 1

In this embodiment, examples of a pixel configuration of a liquid crystal display device formed through a process in which the number of photomasks and the number of photolithography steps are reduced, and an example of a method for forming the pixel configuration will be described with reference to FIGS. 1A and 1B, FIGS. 2A and 2B, FIGS. 3A and 3B, FIGS. 4A1, 4A2, 4B1, and 4B2, FIGS. 5A to 5C, and FIGS. 6A to 6C.

Figure 3A:
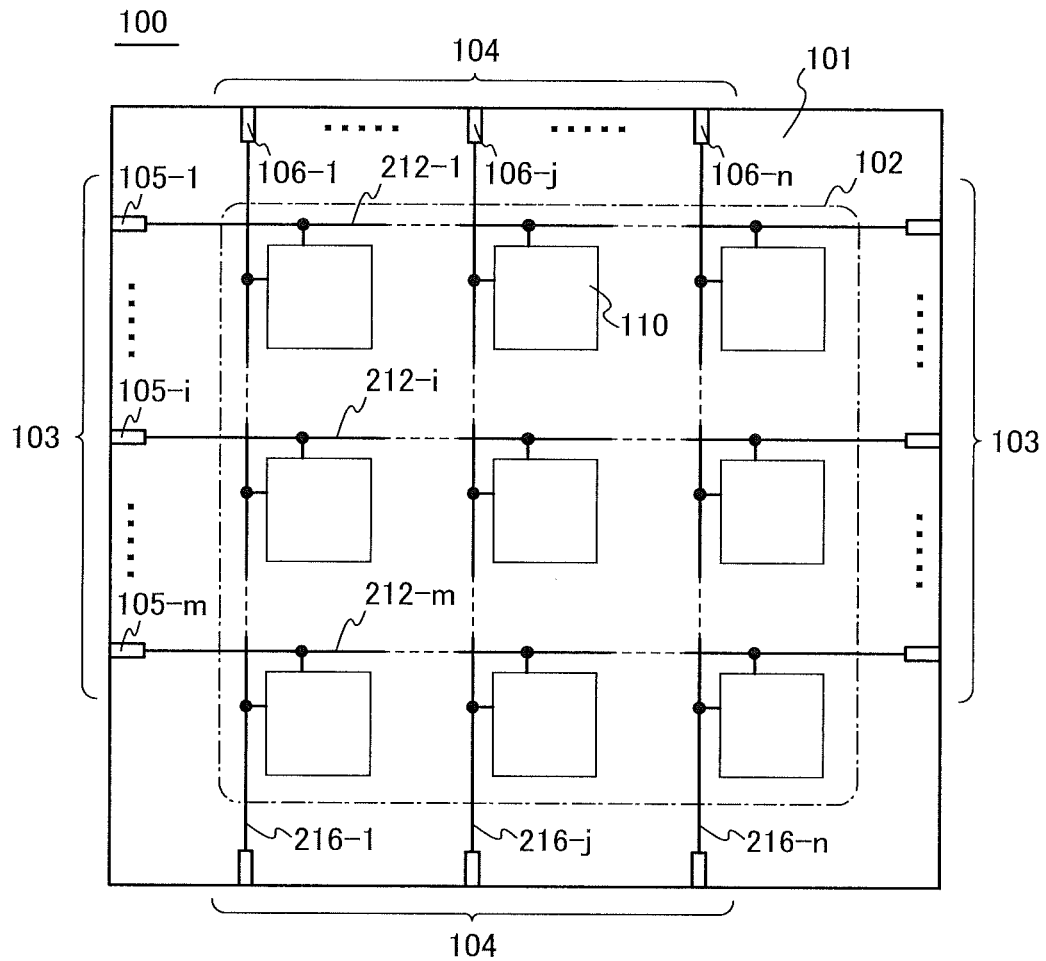
FIGS. 3A and 3B are circuit diagrams of one embodiment of the present invention.

FIG. 3A illustrates an example of the configuration of a semiconductor device 100 that is used in a liquid crystal display device. The semiconductor device 100 includes a pixel region 102, a terminal portion 103 including m terminals 105 (m is an integer of 1 or more), and a terminal portion 104 including n terminals 106 (n is an integer of 1 or more) over a substrate 101. Further, the semiconductor device 100 includes m wirings 212 (gate wirings) electrically connected to the terminal portion 103 and n wirings 216 (data wirings) electrically connected to the terminal portion 104. The pixel region 102 includes a plurality of pixels 110 arranged in a matrix of m (rows) and n (columns). A pixel 110($i,j$) in the i-th row and the j-th column (i is an integer of 1 or more and m or less, and j is an integer of 1 or more and n or less) is electrically connected to a wiring 212-$i$ and a wiring 216-$j$. The wiring 212-$i$ is electrically connected to a terminal 105-$i$, and the wiring 216-$j$ is electrically connected to a terminal 106-$j$.

The terminal portion 103 and the terminal portion 104 are external input terminals and are connected to external control circuits with flexible printed circuits (FPC) or the like. A signal supplied from the external control circuit is input to the semiconductor device 100 through the terminal portion 103 or the terminal portion 104. In FIG. 3A, such terminal portions 103 are provided on the right external side and left external side of the pixel region 102, so that signals are input from two portions. Further, such terminal portions 104 are provided above external side and below external side of the pixel region 102, so that signals are input from two portions. By inputting signals from two portions, signal supply capability is increased and high-speed operation of the semiconductor device 100 is facilitated. In addition, influences of signal delay due to an increase in size of the semiconductor device 100 or an increase in wiring resistance accompanied by an increase in definition can be reduced. Moreover, the semiconductor device 100 can have redundancy, so that reliability of the semiconductor device 100 can be improved. Although two terminal portions 103 and two terminal portions 104 are provided in FIG. 3A, a structure in which one terminal portion 103 and one terminal portion 104 are provided may also be employed.

Figure 3B:
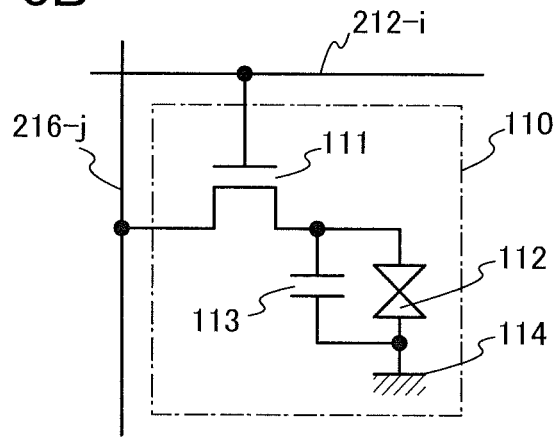

FIG. 3B illustrates a circuit configuration of the pixel 110. The pixel 110 includes a transistor 111, a liquid crystal element 112, and a capacitor 113. A gate electrode of the transistor 111 is electrically connected to the wiring 212-$i$, and one of a source electrode and a drain electrode of the transistor 111 is electrically connected to the wiring 216-$j$. The other of the source electrode and the drain electrode of the transistor 111 is electrically connected to one electrode of the liquid crystal element 112 and one electrode of the capacitor 113. The other electrode of the liquid crystal element 112 and the other electrode of the capacitor 113 are electrically connected to an electrode 114. The potential of the electrode 114 may be a fixed potential such as 0 V, GND, or a common potential.

The transistor 111 has a function of selecting whether an image signal supplied from the wiring 216-$j$ is input to the liquid crystal element 112. After a signal that turns on the transistor 111 is supplied to the wiring 212-$i$, an image signal is supplied to the liquid crystal element 112 from the wiring 216-$j$ through the transistor 111. The transmittance of light is controlled in accordance with the image signal (potential) supplied to the liquid crystal element 112. The capacitor 113 has a function as a storage capacitor (also referred to as a Cs capacitor) for holding a potential supplied to the liquid crystal element 112. The capacitor 113 need not necessarily be provided; however, in the case of providing the capacitor 113, variation in the potential applied to the liquid crystal element 112, which is caused by a current flowing between a source electrode and a drain electrode in an off state of the transistor 111 (off-state current), can be suppressed.

As a semiconductor for forming a channel of the transistor 111, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide.

Alternatively, an oxide semiconductor can be used as a semiconductor for forming the channel of the transistor 111. As the oxide semiconductor, any of an amorphous oxide semiconductor or an oxide semiconductor having crystallinity can be used. The amorphous oxide semiconductor can be obtained by sputtering with the use of an oxide semiconductor target. The oxide semiconductor having crystallinity can be obtained by film formation under a state of heating a substrate to room temperature or higher at the time of sputtering. For example, an oxide semiconductor having crystallinity in which crystallized oxide semiconductor regions are dispersed in an amorphous oxide semiconductor or an oxide semiconductor with a uniform crystal axis alignment as described later in Embodiment 2 can be used.

An oxide semiconductor has a wide energy gap of 3.0 eV to 3.5 eV or more than 3.5 eV. In a transistor obtained by processing an oxide semiconductor under appropriate conditions, the off-state current at ambient temperature (e.g., 25° C.) can be 100 zA ($1\times10^{-19}$ A) or less, 10 zA ($1\times10^{-20}$ A) or less, and further 1 zA ($1\times10^{-21}$ A) or less. Therefore, the potential applied to the liquid crystal element 112 can be held without provision of the capacitor 113. In addition, a liquid crystal display device with low power consumption can be realized.

Figure 1B:
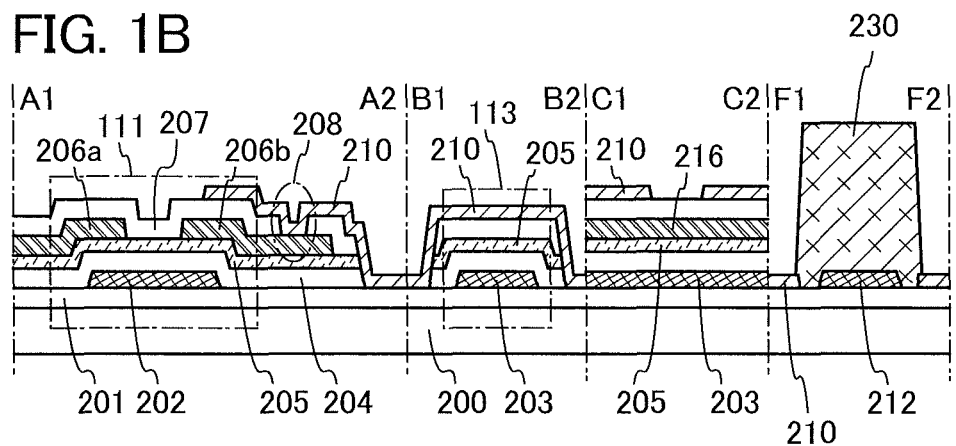

Next, an example of the configuration of the pixel 110 illustrated in FIGS. 3A and 3B will be described with reference to FIGS. 1A and 1B. FIG. 1A is a plan view illustrating a plan structure of the pixel 110, and FIG. 1B is a cross-sectional view illustrating a stacked structure of the pixel 110. Note that chain lines A1-A2, B1-B2, C1-C2, and F1-F2 in FIG. 1A correspond to cross sections A1-A2, B1-B2, C1-C2, and F1-F2 in FIG. 1B, respectively.

In the transistor 111 in this embodiment, a drain electrode 206b is surrounded by a source electrode 206a that is U-shaped (or C-shaped, square-bracket-shaped, or horseshoe-shaped). With such a shape, an enough channel width can be ensured even when the area of the transistor is small, and accordingly, the amount of current flowing at the time of conduction of the transistor (also referred to as the on-state current) can be increased.

If parasitic capacitance generated between a gate electrode 202 and the drain electrode 206b electrically connected to a pixel electrode 210 is large, the transistor is easily influenced by feedthrough, which may cause degradation in display quality because the potential supplied to the liquid crystal element 112 cannot be held accurately. With the structure in which the source electrode 206a is U-shaped and surrounds the drain electrode 206b as described in this embodiment, an enough channel width can be ensured and parasitic capacitance generated between the drain electrode 206b and the gate electrode 202 can be reduced. Therefore, the display quality of a liquid crystal display device can be improved.

The cross section A1-A2 shows the stacked structure of the transistor 111. The transistor 111 is a bottom-gate transistor. The cross section B1-B2 shows the stacked structure of the capacitor 113. Further, the cross section C1-C2 shows the stacked structure of a wiring intersection of a capacitor wiring 203 and the wiring 216.

In the cross section A1-A2, a base layer 201 is formed over a substrate 200, and the gate electrode 202 is formed over the base layer 201. Over the gate electrode 202, a gate insulating layer 204 and a semiconductor layer 205 are formed. Over the semiconductor layer 205, the source electrode 206a and the drain electrode 206b are formed. Further, an insulating layer 207 is formed over the source electrode 206a and the drain electrode 206b so as to be in contact with part of the semiconductor layer 205. The pixel electrode 210 is formed over the insulating layer 207 and is electrically connected to the drain electrode 206b through a contact hole 208 formed in the insulating layer 207.

A part of the gate insulating layer 204, a part of the semiconductor layer 205, and a part of the insulating layer 207 are removed, and the pixel electrode 210 is formed in contact with side surfaces of the gate insulating layer 204, the semiconductor layer 205, and the insulating layer 207. In this embodiment, the semiconductor layer 205 is an i-type (intrinsic) or substantially i-type oxide semiconductor. Since the i-type (intrinsic) or substantially i-type oxide semiconductor can be substantially regarded as an insulator, a problem of leakage current or the like does not arise even when the pixel electrode 210 is in contact with an end portion of the semiconductor layer 205.

In the cross section B1-B2, the base layer 201 is formed over the substrate 200, and the capacitor wiring 203 is formed over the base layer 201. The gate insulating layer 204 and the semiconductor layer 205 are formed over the capacitor wiring 203, and the insulating layer 207 is formed over the semiconductor layer 205. Further, the pixel electrode 210 is formed over the insulating layer 207.

A portion in which the capacitor wiring 203 overlaps with the pixel electrode 210 with the gate insulating layer 204, the semiconductor layer 205, and the insulating layer 207 interposed therebetween functions as the capacitor 113. The gate insulating layer 204, the semiconductor layer 205, and the insulating layer 207 function as dielectric layers. In the case where the dielectric layer formed between the capacitor wiring 203 and the pixel electrode 210 has a layered structure, even if a pinhole is generated in one layer in the dielectric layer, the pinhole is covered with another layer of the dielectric layer and the capacitor 113 can operate normally. The relative permittivity of an oxide semiconductor is as high as 14 to 16. Accordingly, when an oxide semiconductor is used for the semiconductor layer 205, the capacitance value of the capacitor 113 can be increased.

In the cross section C1-C2, the base layer 201 is formed over the substrate 200, and the capacitor wiring 203 is formed over the base layer 201. Further, the gate insulating layer 204 and the semiconductor layer 205 are formed over the capacitor wiring 203. Furthermore, the wiring 216 is formed over the semiconductor layer 205, and the insulating layer 207 and the pixel electrode 210 are formed over the wiring 216.

In the cross section F1-F2, the base layer 201 is formed over the substrate 200, and the wiring 212 that is a gate wiring is formed over the base layer 201. Although the pixel electrode 210 is adjacent to the wiring 212, they are not electrically connected to each other. An insulating layer 230 is formed over the wiring 212. The insulating layer 230 functions as both a spacer for maintaining a space that is to be filled with a liquid crystal and a protective layer for preventing exposure of the wiring 212. This region divides the semiconductor layer 205, whereby electrical short circuit between adjacent transistors can be suppressed. The pixel electrode 210 in contact with the base layer 201 in the cross section F1-F2 may be completely removed.

A structure similar to that of the portion indicated by the chain line F1-F2 may be additionally provided to the pixel illustrated in FIGS. 1A and 1B, specifically to the portion indicated by a chain line G1-G2 as illustrated in FIG. 11A. FIG. 11B is a cross-sectional view of the portion along G1-G2. In the cross section G1-G2, the base layer 201 is formed over the substrate 200, and the capacitor wiring 203 is formed over the base layer 201. Although the pixel electrode 210 is adjacent to the capacitor wiring 203, they are electrically disconnected from each other. An insulating layer 231 is formed over the capacitor wiring 203. The insulating layer 231 functions as both a spacer for maintaining a space that is to be filled with a liquid crystal and a protective layer for preventing exposure of the capacitor wiring 203. Accordingly, electrical short circuit between transistors can be suppressed. Alternatively, as illustrated in FIG. 11C, a conductive layer 240 that is formed at the time of formation of the pixel electrode 210 may be left over the capacitor wiring 203. The conductive layer 240 is electrically disconnected from the pixel electrode 210. For comparison, the cross section F1-F2 illustrated in FIG. 1B is again illustrated in FIG. 11D. FIG. 11E illustrates another example of the structure of the cross section F1-F2, which is similar to the structure along the cross section G1-G2 in FIG. 11C. Either the structure of FIG. 11D or the structure of FIG. 11E may be employed. Further, the structure along the cross section F1-F2 in FIG. 11E may be employed for the configuration example illustrated in FIGS. 1A and 1B. The pixel electrode 210 in contact with the base layer 201 in the cross section G1-G2 may be completely removed.

Figure 2A:
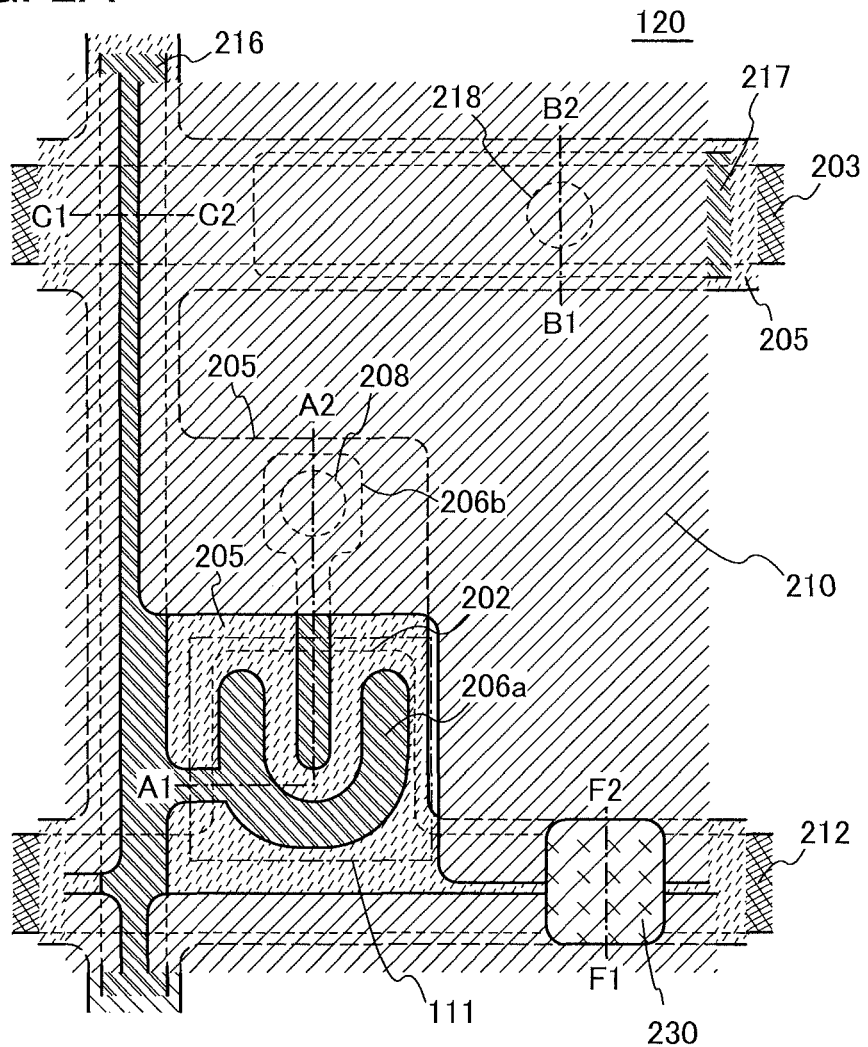
FIGS. 2A and 2B are a plan view and a cross-sectional view, respectively, of one embodiment of the present invention.
Figure 2B:
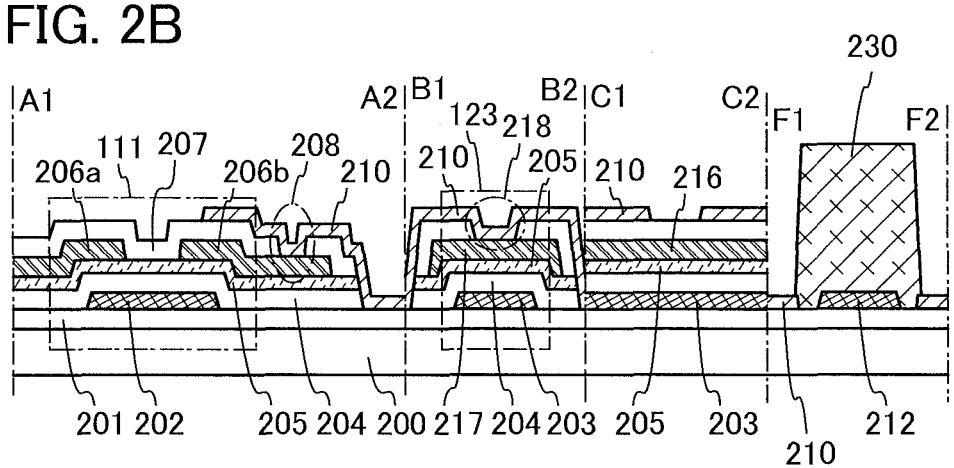

Next, another example of the pixel configuration different from that illustrated in FIGS. 1A and 1B will be described with reference to FIGS. 2A and 2B. FIG. 2A is a plan view illustrating a plan structure of a pixel 120, and FIG. 2B is a cross-sectional view illustrating a stacked structure of the pixel 120. Note that chain lines A1-A2, B1-B2, C1-C2, and F1-F2 in FIG. 2A correspond to cross sections A1-A2, B1-B2, C1-C2, and F1-F2 in FIG. 2B, respectively. The pixel 120 illustrated in FIGS. 2A and 2B is different from the pixel 110 illustrated in FIGS. 1A and 1B in the structure of the capacitor.

In the cross section B1-B2, the base layer 201 is formed over the substrate 200, and the capacitor wiring 203 is formed over the base layer 201. The gate insulating layer 204 and the semiconductor layer 205 are formed over the capacitor wiring 203, and an electrode 217 is formed over the semiconductor layer 205. The insulating layer 207 is formed over the electrode 217, and the pixel electrode 210 is formed over the insulating layer 207. The pixel electrode 210 is electrically connected to the electrode 217 through a contact hole 218 formed in the insulating layer 207.

A portion in which the capacitor wiring 203 overlaps with the electrode 217 with the gate insulating layer 204 and the semiconductor layer 205 interposed therebetween functions as a capacitor 123. Since the insulating layer 207 is not provided between the capacitor wiring 203 and the electrode 217 in the capacitor 123, the thickness of the dielectric layer can be reduced as compared to the capacitor 113. Accordingly, the capacitance value of the capacitor 123 can be larger than that of the capacitor 113.

Figure 12:
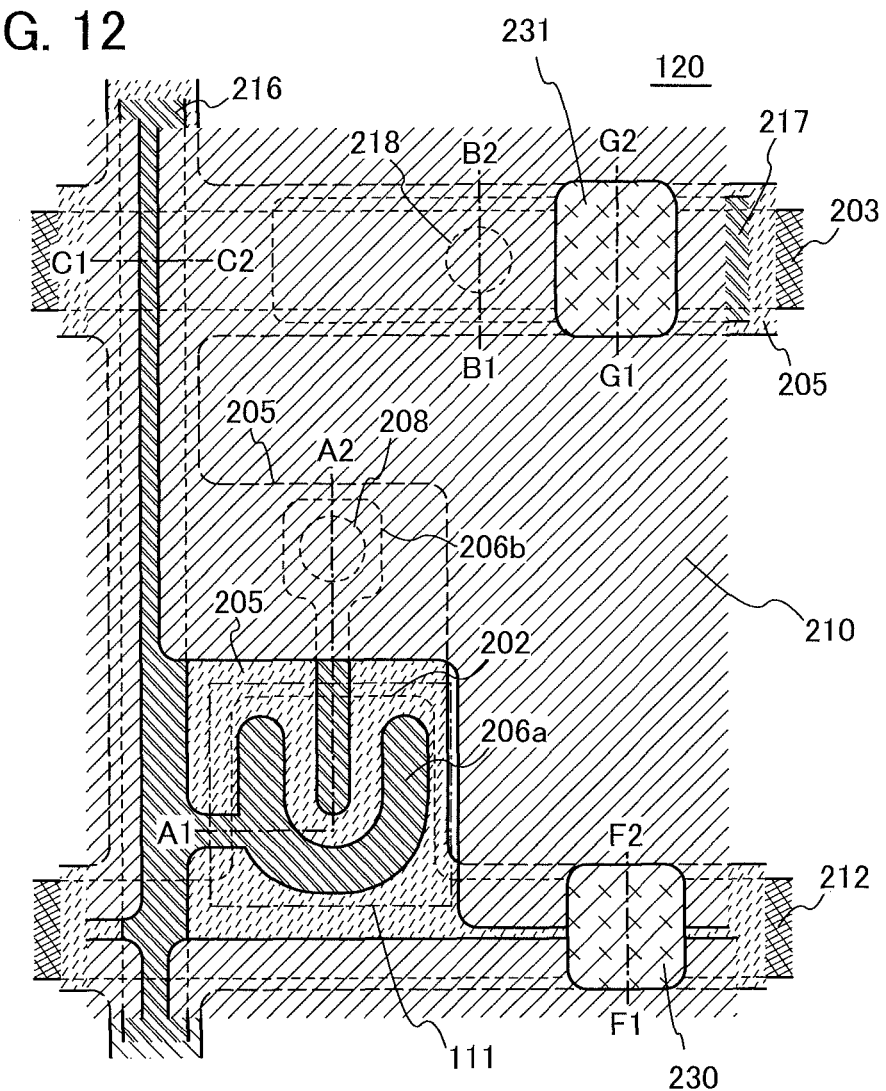
FIG. 12 is a plan view of one embodiment of the present invention.

A structure similar to that of the portion indicated by the cross section F1-F2 may be additionally provided to the pixel illustrated in FIGS. 2A and 2B, specifically to the portion indicated by the cross-section G1-G2 as illustrated in FIG. 12. The insulating layer 231 is provided for purposes similar to those described with reference to FIGS. 11A to 11E. The structure along the cross section F1-F2 in FIG. 11E may be employed for the configuration example illustrated in FIGS. 2A and 2B. The pixel electrode 210 in contact with the base layer 201 in the cross section F1-F2 or G1-G2 may be completely removed.

Next, examples of the structure of the terminal 105 and the terminal 106 will be described with reference to FIGS. 4A1, 4A2, 4B1, and 4B2. FIGS. 4A1 and 4A2 are a plan view and a cross-sectional view, respectively, of the terminal 105. A chain line D1-D2 in FIG. 4A1 corresponds to a cross section D1-D2 in FIG. 4A2. FIGS. 4B1 and 4B2 are a plan view and a cross-sectional view, respectively, of the terminal 106. A chain line E1-E2 in FIG. 4B1 corresponds to a cross section E1-E2 in FIG. 4B2.

In the cross section D1-D2, the base layer 201 is formed over the substrate 200, and the wiring 212 is formed over the baser layer 201. The gate insulating layer 204, the semiconductor layer 205, and the insulating layer 207 are formed over the wiring 212. An electrode 221 is formed over the insulating layer 207, and the electrode 221 is electrically connected to the wiring 212 through a contact hole 219 foimed in the gate insulating layer 204, the semiconductor layer 205, and the insulating layer 207.

In the cross section E1-E2, the base layer 201, the gate insulating layer 204, and the semiconductor layer 205 are formed over the substrate 200. The wiring 216 is formed over the semiconductor layer 205, and the insulating layer 207 is formed over the wiring 216. An electrode 222 is formed over the insulating layer 207, and the electrode 222 is electrically connected to the wiring 216 through a contact hole 220 formed in the insulating layer 207.

Then, a manufacturing method of the pixel portion of the liquid crystal display device described with reference to FIGS. 1A and 1B will be described with reference to FIGS. 5A to 5C and FIGS. 6A to 6C. Note that cross sections A1-A2, B1-B2, C1-C2, and F1-F2 in FIGS. 5A to 5C and FIGS. 6A to 6C are cross-sectional views of the portions taken along the chain lines A1-A2, B1-B2, C1-C2, and F1-F2 in FIG. 1A, respectively.

In FIGS. 5A to 5C and FIGS. 6A to 6C, a cross section D1-D2 shows the stacked structure of the terminal 105, and a cross section E1-E2 shows the stacked structure of the terminal 106. In the cross sections D1-D2 and E1-E2, D2 and E2 correspond to edge portions of the substrate.

First, an insulating layer to be the base layer 201 is formed with a thickness of greater than or equal to 50 nm and less than or equal to 300 nm, preferably greater than or equal to 100 nm and less than or equal to 200 nm over the substrate 200. As the substrate 200, as well as a glass substrate or a ceramic substrate, a plastic substrate or the like having heat resistance to withstand a process temperature in this manufacturing process can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680× 880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm). In this embodiment, a substrate of aluminoborosilicate glass is used as the substrate 200.

The base layer 201 can be formed with a single-layer structure or a stacked structure including at least one of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of an impurity element from the substrate 200. Note that in this specification, silicon nitride oxide includes more nitrogen than oxygen and, in the case where measurements are performed using Rutherford backscattering spectrometry (RBS) and hydrogen forward scattering spectrometry (HFS), includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The base layer 201 can be formed as appropriate by a sputtering method, a CVD method, a coating method, a printing method, or the like.

In this embodiment, a stack of layers of silicon nitride and silicon oxide is used as the base layer 201. Specifically, a layer of silicon nitride is formed with a thickness of 50 nm over the substrate 200, and a layer of silicon oxide is formed with a thickness of 150 nm over the layer of silicon nitride. Note that the base layer 201 may be doped with phosphorus (P) or boron (B).

When a halogen element such as chlorine or fluorine is contained in the base layer 201, a function of preventing diffusion of impurity elements from the substrate 200 can be further improved. The peak of the concentration of a halogen element contained in the base layer 201 may be higher than or equal to $1\times10^{15}/cm^3$ and lower than or equal to $1\times10^{20}/cm^3$ when measured by secondary ion mass spectrometry (SIMS).

Alternatively, gallium oxide may be used for the base layer 201. Further alternatively, a stacked structure including a layer of gallium oxide and the above insulating layer may be used for the base layer 201. Gallium oxide is a material which is hardly charged; therefore, variation in threshold voltage due to charge buildup of the insulating layer can be suppressed.

Next, over the base layer 201, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 202, the capacitor wiring 203, and the wiring 212 are formed.

The conductive layer for forming the gate electrode 202, the capacitor wiring 203, and the wiring 212 can be formed to have a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

Since the conductive layer is formed into a wiring, it is preferable to use Al or Cu which is a low-resistance material. When Al or Cu is used, signal delay is reduced, so that higher image quality can be expected. Al has low heat resistance; therefore, defects due to a hillock, a whisker, or migration tend to be caused. In order to prevent migration of Al, a layer of a metal material having a higher melting point than Al such as Mo, Ti, or W is preferably stacked over an Al layer. In the case where a material containing Al is used for the conductive layer, the maximum process temperature in later steps is preferably lower than or equal to 380° C., further preferably lower than or equal to 350° C.

Also when Cu is used for the conductive layer, in order to prevent a defect due to migration and diffusion of Cu elements, a metal material having a higher melting point than Cu, such as Mo, Ti, or W, is preferably stacked over a layer of Cu. Further, in the case where a material containing Cu is used for the conductive layer, the maximum process temperature in later steps is preferably lower than or equal to 450° C.

In this embodiment, as the conductive layer, a Ti layer with a thickness of 5 nm is formed over the base layer 201 and a Cu layer with a thickness of 250 nm is formed over the Ti layer. Then, the conductive layer is selectively removed by etching through the first photolithography step, whereby the gate electrode 202, the capacitor wiring 203, and the wiring 212 are formed (see FIG. 5A).

Note that the resist mask used in the photolithography step may be formed by an inkjet method. An inkjet method needs no photomask; thus, manufacturing cost can be reduced. The resist mask is to be removed after the etching step, and the description about the removal of the resist mask in each photolithography step is omitted in this embodiment.

Then, the gate insulating layer 204 is formed with a thickness of greater than or equal to 50 nm and less than or equal to 800 nm, preferably greater than or equal to 100 nm and less than or equal to 600 nm over the gate electrode 202, the capacitor wiring 203, and the wiring 212. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate (HfSi$_x$O$_y$ (x>0, y>0)), hafnium silicate to which nitrogen is added, hafnium aluminate to which nitrogen is added, or the like by a plasma CVD method, a sputtering method, or the like. The gate insulating layer 204 is not limited to a single layer, and a stack of different layers may be used. For example, the gate insulating layer 204 may be formed in the following manner: a silicon nitride (SiN$_y$ (y>0)) layer is formed by a plasma CVD method as a gate insulating layer A and a silicon oxide (SiO$_x$ (x>0)) layer is stacked over the gate insulating layer A as a gate insulating layer B.

Other than a sputtering method and a plasma CVD method, the gate insulating layer 204 can be formed by a film formation method such as a high-density plasma CVD method using microwaves (e.g., with a frequency of 2.45 GHz).

In this embodiment, a stack of layers of silicon nitride and silicon oxide is used as the gate insulating layer 204. Specifically, a layer of silicon nitride is formed with a thickness of 50 nm over the gate electrode 202, and a layer of silicon oxide is formed with a thickness of 100 nm over the layer of silicon nitride.

In addition, the gate insulating layer 204 also serves as a protective layer. With a structure in which the gate electrode 202 containing Cu is covered with the insulating layer containing silicon nitride, diffusion of Cu from the gate electrode 202 can be prevented.

In the case where the semiconductor layer formed later is formed using an oxide semiconductor, the gate insulating layer 204 may be formed using an insulating material containing the same kind of component as the oxide semiconductor. In the case of stacking layers of different materials to form the gate insulating layer 204, a layer in contact with the oxide semiconductor may be formed using an insulating material containing the same kind of component as the oxide semiconductor. This is because such a material is compatible with the oxide semiconductor, and therefore, the use of such a material for the gate insulating layer 204 enables a state of the interface between the gate insulating layer 204 and the oxide semiconductor to be kept well. Here, "the same kind of component as the oxide semiconductor" means one or more elements selected from constituent elements of the oxide semiconductor. For example, in the case where the oxide semiconductor is formed using an In—Ga—Zn-based oxide semiconductor material, gallium oxide or the like is given as an insulating material containing the same kind of component as the oxide semiconductor.

In the case of employing a stacked structure for the gate insulating layer 204, the gate insulating layer 204 may have a stacked structure of a film formed using an insulating material containing the same kind of component as the oxide semiconductor and a film formed using a material different from that of the film.

In order that the oxide semiconductor layer contain hydrogen, a hydroxyl group, and moisture as little as possible, it is preferable to preheat the substrate 200 in a preheating chamber of a sputtering apparatus as pretreatment before the formation of the oxide semiconductor layer so that impurities such as hydrogen or moisture adsorbed on the substrate 200 or the gate insulating layer 204 are eliminated and removed. As an evacuation unit provided in the preheating chamber, a cryopump is preferable. Note that this preheating treatment can be omitted. Further, this preheating may be similarly performed on the substrate 200 over which the gate electrode 202, the capacitor wiring 203, and the wiring 212 are fainted before the formation of the gate insulating layer 204.

An oxide semiconductor to be used for the semiconductor layer 205 preferably contains at least indium (In) or zinc (Zn). In particular, both In and Zn are preferably contained. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Further, $SiO_2$ may be contained in the above oxide semiconductor.

Note that here, for example, an "In—Ga—Zn-based oxide" means an oxide containing In, Ga, and Zn as its main component, in which there is no particular limitation on the ratio of In:Ga:Zn. In addition to In, Ga, and Zn, another metal element may be contained.

As the oxide semiconductor, a material expressed by a chemical formula, $InMO_3(ZnO)_m$ (m>0, and m is not an integer) may be used. Here, M represents one or more metal elements selected from Ga, Fe, Mn, or Co. Alternatively, as the oxide semiconductor, a material expressed by a chemical foimula, $In_2SnO_5(ZnO)_n$ (n>0, and n is an integer) may be used.

For example, an In—Ga—Zn-based oxide with an atomic ratio of In Ga:Zn=1:1:1 (=⅓:⅓:⅓) or In:Ga:Zn=2:2:1 (=⅖:⅖:⅕), or any of oxides whose composition is in the neighborhood of the above compositions can be used. Alternatively, an In—Sn—Zn-based oxide with an atomic ratio of In:Sn:Zn=1:1:1 (=⅓:⅓:⅓), In:Sn:Zn=2:1:3 (=⅓:⅙:½), or In:Sn:Zn=2:1:5 (=¼:⅛:⅝), or any of oxides whose composition is in the neighborhood of the above compositions may be used.

However, the composition is not limited to those described above, and a material having an appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the r-neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, a mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. The $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x, y) - Z_0|dxdy \qquad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In this embodiment, an oxide semiconductor film is formed by a sputtering method, an evaporation method, a PCVD method, a PLD method, an ALD method, an MBE method, or the like (see FIG. 5B).

The oxide semiconductor film is formed preferably by a sputtering method in an oxygen gas atmosphere at a substrate heating temperature of 100° C. to 600° C. inclusive, preferably 150° C. to 550° C. inclusive, and further preferably 200° C. to 500° C. inclusive. The thickness of the oxide semiconductor film is more than or equal to 1 inn and less than or equal to 40 nm, and preferably more than or equal to 3 mm and less than or equal to 20 nm. As the substrate heating temperature at the time of film formation is higher, the impurity concentration of the obtained oxide semiconductor film is lower. In addition, the atomic arrangement of the oxide semiconductor film is ordered and the oxide semiconductor film is densified; accordingly, a polycrystal or a polycrystal with c-axis alignment (in this specification referred to as a CAAC) is more easily formed. Furthermore, by the film formation in the oxygen gas atmosphere, a polycrystal or a CAAC is more easily formed because an unnecessary atom of a rare gas or the like is not included. Alternatively, a mixed atmosphere of an oxygen gas and a rare gas may be used; in such a case, the percentage of the oxygen gas is 30 vol. % or more, preferably 50 vol. % or more, and further preferably 80 vol. % or more.

As the oxide semiconductor film is thinner, the short channel effect of the transistor can be reduced. However, a too small thickness may increase the influence of the interface scattering and reduce the field effect mobility.

In the case of a film of an In—Ga—Zn-based material as an oxide semiconductor film by a sputtering method, it is preferable to use an In—Ga—Zn—O target having an atomic ratio of In:Ga:Zn=1:1:1, 4:2:3, 3:1:2, 1:1:2, 2:1:3, or 3:1:4. When an oxide semiconductor film is formed using an In—Ga—Zn—O target having the aforementioned atomic ratio, a polycrystal or a CAAC is easily formed.

In the case of forming a film of an In—Sn—Zn-based material as an oxide semiconductor film by a sputtering method, it is preferable to use an In—Sn—Zn—O target having an atomic ratio of In:Sn:Zn=1:1:1, 2:1:3, 1:2:2, or 20:45:35. When an oxide semiconductor film is formed using an In—Sn—Zn—O target having the aforementioned atomic ratio, a polycrystal or a CAAC is easily formed.

Next, heat treatment is performed. The heat treatment is performed in a reduced pressure atmosphere, an inert atmosphere, or an oxidation atmosphere. By the heat treatment, the impurity concentration in the oxide semiconductor film can be reduced.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor film can be reduced; however, oxygen vacancies are caused at the same time. By the heat treatment in the oxidation atmosphere, the caused oxygen vacancies can be reduced.

By performing heat treatment in addition to the substrate heating at the time of film formation on the oxide semiconductor film, the impurity level in the film can be significantly reduced. As a result, the field effect mobility of the transistor can be increased.

The filling rate of the metal oxide target is more than or equal to 90% and less than or equal to 100%, and preferably more than or equal to 95% and less than or equal to 100%. The use of a metal oxide target with a high filling rate enables the formed oxide semiconductor layer to have high density.

It is preferable that a high-purity gas from which impurities such as hydrogen, water, a hydroxyl group, and a hydride are removed be used as a sputtering gas for the formation of the oxide semiconductor layer.

In the formation of the oxide semiconductor layer, the substrate is held in a deposition chamber under a reduced pressure. In the case where Al is used for a wiring layer formed by the first photolithography step, the substrate temperature at the time of formation of the oxide semiconductor layer is set to be 380° C. or lower, preferably 350° C. or lower. In the case where Cu is used for a wiring layer that is formed by the first photolithography step, the substrate temperature is set to be 450° C. or lower.

In the case where the oxide semiconductor layer is formed under a state in which the substrate is heated, the concentration of impurities such as hydrogen, moisture, a hydride, or a hydroxyl group in the oxide semiconductor layer can be reduced. In addition, damage by sputtering can be reduced. Then, a sputtering gas from which hydrogen and moisture are removed is introduced into the deposition chamber while moisture remaining therein is removed, and the oxide semiconductor layer is formed with the use of the above target.

In order to remove moisture remaining in the deposition chamber, an entrapment vacuum pump such as a cryopump, an ion pump, or a titanium sublimation pump is preferably used. Further, an evacuation unit may be a turbo molecular pump provided with a cold trap. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration of the oxide semiconductor layer formed in the deposition chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferable because powder substances (also referred to as particles or dust) generated in film formation can be reduced and the film thickness can be made uniform.

The concentrations of alkaline metals such as sodium (Na), lithium (Li), and potassium (K) in the oxide semiconductor layer are preferably as follows: the Na concentration is $5\times10^{16}$ cm$^{-3}$ or lower, preferably $1\times10^{16}$ cm$^{-3}$ or lower, and further preferably $1\times10^{15}$ cm$^{-3}$ or lower; the Li concentration is $5\times10^{15}$ cm$^{-3}$ or lower, and preferably $1\times10^{15}$ cm$^{-3}$ or lower; and the K concentration is $5\times10^{15}$ cm$^{-3}$ or lower, and preferably $1\times10^{15}$ cm$^{-3}$ or lower.

It has been pointed out that an oxide semiconductor is insensitive to impurities, there is no problem when a considerable amount of metal impurities is contained in the oxide semiconductor, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The Present Status", *KOTAI BUTSURI* (*SOLID STATE PHYSICS*), 2009, Vol. 44, pp. 621-633). However, such consideration is not proper. Alkali metal is not an element for forming in an oxide semiconductor, and therefore, is an impurity. Also, alkaline-earth metal is an impurity in the case where alkaline-earth metal is not an element for forming an oxide semiconductor. Alkali metal, in particular, Na becomes Na$^+$ when an insulating layer in contact with the oxide semiconductor layer is an oxide and Na diffuses into the insulating layer. Further, in the oxide semiconductor layer, Na cuts or enters a bond between metal and oxygen which constitute the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, the concentrations of alkali metals in the oxide semiconductor is strongly required to set in the aforementioned ranges in the case where the hydrogen concentration in the oxide semiconductor is lower than or equal to $5\times10^{19}$ cm$^{-3}$, particularly lower than or equal to $5\times10^{18}$ cm$^{-3}$.

Next, first heat treatment is performed. By the first heat treatment, excessive hydrogen (including water and a hydroxyl group) in the oxide semiconductor layer can be removed (dehydration or dehydrogenation).

The first heat treatment is performed at a temperature higher than or equal to 250° C. and lower than or equal to 750° C., or higher than or equal to 400° C. and lower than the strain point of the substrate, in a reduced pressure atmosphere, an inert gas atmosphere such as a nitrogen atmosphere or a rare gas atmosphere, an oxygen atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system). Note that in the case where Al is used for a wiring layer formed by the first photolithography step, the heat treatment temperature is set to be 380° C. or lower, preferably 350° C. or lower. In the case where Cu is used for a wiring layer formed by the first photolithography step, the heat treatment temperature is set to be 450° C. or lower. In this embodiment, the substrate is introduced into an electric furnace which is a kind of heat treatment apparatuses, and heat treatment is performed on the oxide semiconductor layer at 450° C. in a nitrogen atmosphere for one hour.

Note that the heat treatment apparatus is not limited to the electrical furnace, and may include a device for heating a process object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas such as argon, is used.

For example, as the first heat treatment, GRTA may be performed as follows. The substrate is transferred and put in an inert gas heated to a high temperature, is heated for several minutes, and is transferred and taken out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The carrier concentration of the oxide semiconductor, in which hydrogen is reduced to a sufficiently low concentration so that the oxide semiconductor is purified and in which defect states in an energy gap due to oxygen deficiency are reduced by sufficiently supplying oxygen, is lower than $1\times10^{12}/cm^3$, preferably lower than $1\times10^{11}/cm^3$, further preferably lower than $1.45\times10^{10}/cm^3$. For example, the off-state current (per unit channel width (1 μm) here) at room temperature (25° C.) is 100 zA/μm (1 zA (zeptoampere) is $1\times10^{-21}$ A) or less, preferably 10 zA/μm or less. The off-state current at 85° C. is 100 zA/μm ($1\times10^{-19}$ A/μm) or less, preferably 10 zA/μm ($1\times10^{-20}$ A/μm) or less. The transistor 111 with very excellent off-state current characteristics can be obtained with the use of such an i-type (intrinsic) or substantially i-type oxide semiconductor.

The electrical characteristics of a transistor including a purified oxide semiconductor, such as the threshold voltage and the on-state current, have almost no temperature dependence. Further, transistor characteristics hardly change due to light deterioration.

As described above, variation in the electrical characteristics of a transistor including a purified and electrically i-type (intrinsic) oxide semiconductor is suppressed and the transistor is electrically stable. Consequently, a highly reliable liquid crystal display device including an oxide semiconductor, which has stable electrical characteristics, can be provided.

Next, a conductive layer to be processed into the source electrode 206a, the drain electrode 206b, and the wiring 216 is formed over the semiconductor layer 205. The conductive layer for forming the source electrode 206a, the drain electrode 206b, and the wiring 216 can be formed using a material and a method similar to those of the gate electrode 202. The conductive layer for forming the source electrode 206a, the drain electrode 206b, and the wiring 216 may be framed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

In this embodiment, the conductive layer is formed as follows: a Ti layer with a thickness of 5 nm is formed over the semiconductor layer 205, and a Cu layer with a thickness of 250 nm is formed over the Ti layer. Then, a resist mask is formed by a second photolithography step and the conductive layer is selectively etched; thus, the source electrode 206a, the drain electrode 206b, and the wiring 216 are formed (see FIG. 5C).

Figure 6A:
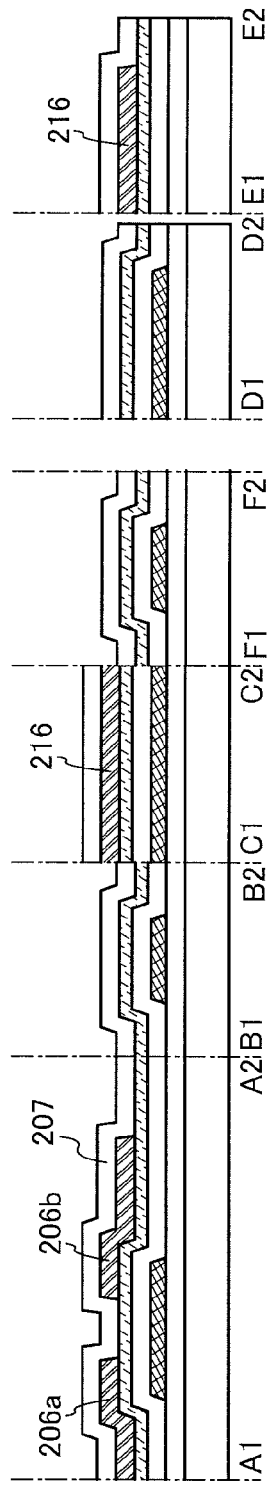
FIGS. 6A to 6C are cross-sectional process views of one embodiment of the present invention.
Figure 6B:
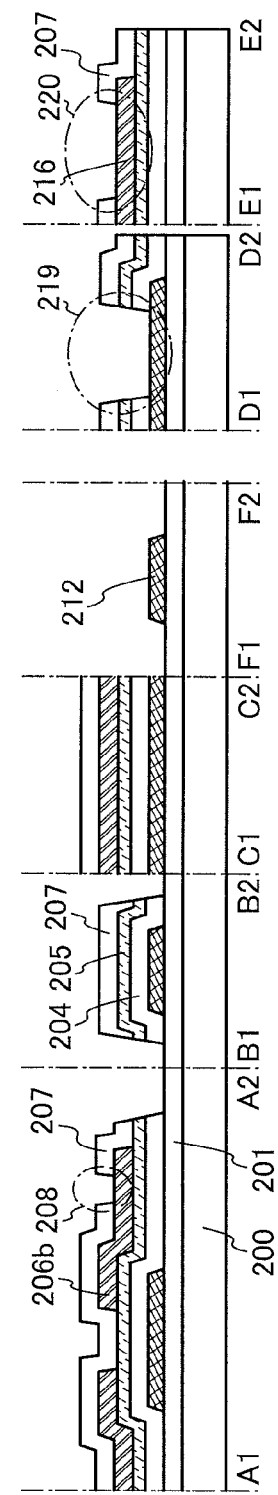

Next, the insulating layer 207 is formed over the source electrode 206a, the drain electrode 206b, and the wiring 216 (see FIG. 6A). The insulating layer 207 can be formed using a material and a method similar to those of the gate insulating layer 204 or the base layer 201. Sputtering is preferably employed in terms of low possibility of entry of hydrogen, water, and the like. If hydrogen is contained in the insulating layer 207, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to use a method by which hydrogen and an impurity containing hydrogen are not mixed in the insulating layer 207, for forming the insulating layer 207.

As the insulating layer 207, an inorganic insulating material such as silicon oxide, silicon oxynitride, hafnium oxide, aluminum oxide, or gallium oxide can be typically used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the insulating layer 207 or stacked over the insulating layer 207.

In this embodiment, a 200-nm-thick silicon oxide layer is formed as the insulating layer 207 by a sputtering method. The substrate temperature in film formation may be higher than or equal to room temperature and lower than or equal to 300° C. and in this embodiment, is 100° C. The silicon oxide layer can be formed by sputtering in a rare gas (typically argon) atmosphere, an oxygen atmosphere, or a mixed atmosphere of a rare gas and oxygen. As a target, a silicon oxide target or a silicon target can be used. For example, a silicon oxide layer can be formed by sputtering in an atmosphere containing oxygen with the use of silicon for the target.

In order to remove remaining moisture from the deposition chamber at the time of formation of the insulating layer 207, an entrapment vacuum pump (e.g., a cryopump) is preferably used. When the insulating layer 207 is formed in the deposition chamber evacuated using a cryopump, the impurity concentration in the insulating layer 207 can be reduced. In addition, as an exhaustion unit for removing moisture remaining in the chamber used for depositing the insulating layer 207, a turbo molecular pump provided with a cold trap may be used.

It is preferable that a high-purity gas from which impurities such as hydrogen, water, a hydroxyl group, or a hydride have been removed be used as a sputtering gas for the formation of the insulating layer 207.

Then, second heat treatment may be performed in a reduced pressure atmosphere, an inert gas atmosphere, an oxygen atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for a wiring layer formed by the first photolithography step or the second photolithography step, the heat treatment temperature is set to be 380° C. or lower, preferably 350° C. or lower. In the case where Cu is used for a wiring layer formed by the first photolithography step or the second photolithography step, the heat treatment temperature is set to be 450° C. or lower. For example, the second heat treatment may be performed at 450° C. for one hour in a nitrogen atmosphere. By the second heat treatment, part of the oxide semiconductor layer (a channel formation region) is heated in the state of being in contact with the insulating layer 207, so that oxygen can be supplied from the insulating layer 207 containing oxygen to the semiconductor layer 205. It is preferable that the above atmosphere do not contain water, hydrogen, or the like.

Next, a resist mask is formed by a third photolithography step, and the insulating layer 207, the semiconductor layer 205, and the gate insulating layer 204 are selectively etched. At this time, over the drain electrode 206b, only the insulating layer 207 is removed, so that the contact hole 208 is formed. Further, over the wiring 216 in the cross section E1-E2, only the insulating layer 207 is removed, so that the contact hole 220 is formed. Over the wiring 212 in the cross section D1-D2, the insulating layer 207, the semiconductor layer 205, and the gate insulating layer 204 are removed, so that the contact hole 219 is formed. In addition, over the wiring 212 in the cross section F1-F2, the insulating layer 207, the semiconductor layer 205, and the gate insulating layer 204 are removed (see FIG. 6B).

At this time, the insulating layer 207, the semiconductor layer 205, and the gate insulating layer 204 in a pixel opening portion (a portion where a conductive layer or the like is provided in a pixel) may be left without being etched. Note that by removing the insulating layer 207, the semiconductor layer 205, and the gate insulating layer 204 in the pixel opening portion as much as possible, the light transmittance of the pixel in the case of a liquid crystal display device of transmissive type is increased. Accordingly, the backlight use efficiency is increased, and lower power consumption and higher display quality can be expected.

For the etching of the insulating layer 207, the semiconductor layer 205, and the gate insulating layer 204, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

As the dry etching, a parallel-plate reactive ion etching (RIE) method, an inductively coupled plasma (ICP) etching method, or the like can be used. Since the base layer 201 has a function of preventing diffusion of an impurity element from the substrate 200, for the above etching, etching conditions are preferably adjusted so as to etch the base layer 201 as little as possible.

Generally, etching of a semiconductor layer and formation of a contact hole in an insulating layer are separately performed through different photolithography steps and different etching steps. According to a manufacturing process of this embodiment, etching of a semiconductor layer and formation of a contact hole in an insulating layer can be performed at the same time by one-time photolithography step and one-time etching step. Therefore, not only the number of photomasks but also the number of photolithography steps itself can be reduced. In other words, a liquid crystal display device can be manufactured at low cost with high productivity with a smaller number of photolithography steps.

Further, according to a manufacturing process of this embodiment, a photoresist is not directly formed on an oxide semiconductor layer. Further, since the channel formation region of the oxide semiconductor layer is protected by the insulating layer 207, moisture does not attach to the channel formation region of the oxide semiconductor layer in a separation and cleaning step of the photoresist. Accordingly, characteristic variation of the transistor 111 is reduced and reliability is increased.

Figure 6C:
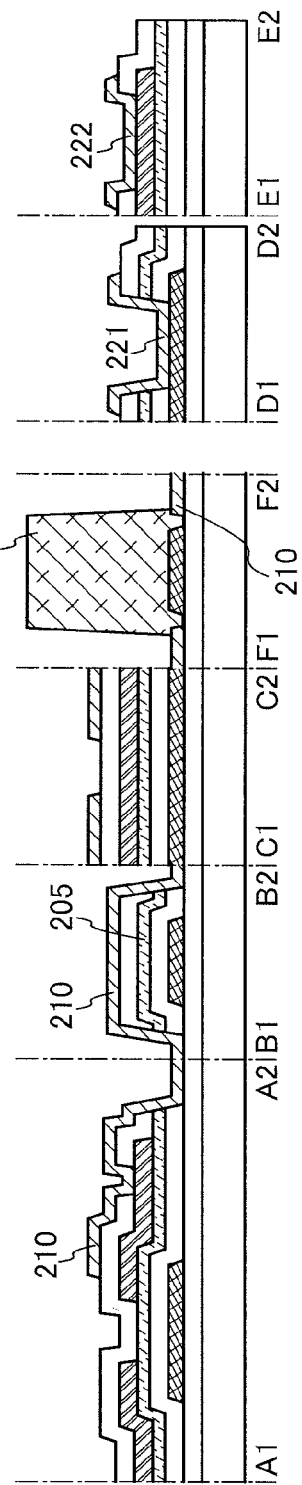

Next, a light-transmitting conductive layer that is to be processed into the pixel electrode 210, the electrode 221, and the electrode 222 is formed with a thickness of more than or equal to 30 nm and less than or equal to 200 nm, preferably more than or equal to 50 nm and less than or equal to 100 nm, over the insulating layer 207 by a sputtering method, a vacuum evaporation method, or the like (see FIG. 6C).

For the light-transmitting conductive layer, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. Alternatively, a material including 1 to 10 graphene sheets may be used.

In this embodiment, an ITO layer with a thickness of 80 nm is formed as the light-transmitting conductive layer. By a fourth photolithography step, a resist mask is formed, and the light-transmitting conductive layer is selectively etched; thus, the pixel electrode 210, the electrode 221, and the electrode 222 are formed.

The pixel electrode 210 is electrically connected to the drain electrode 206b through the contact hole 208. The electrode 221 is electrically connected to the wiring 212 through the contact hole 219. Further, the electrode 222 is electrically connected to the wiring 216 through the contact hole 220.

It is important that the wiring 212 and the wiring 216 are covered with a conductive oxide material such as ITO without leaving them exposed at the contact hole 219 and the contact hole 220. Since the wiring 212 and the wiring 216 are metal layers, if the wiring 212 and the wiring 216 are left exposed, the exposed surfaces are oxidized and contact resistance with an FPC or the like is increased; as a result, reliability is decreased. By covering the exposed surfaces of the wiring 212 and the wiring 216 with a conductive oxide material such as ITO, an increase in contact resistance can be prevented and reliability of the liquid crystal display device can be increased.

For the same reason, the insulating layer 230 functioning as a protective layer is formed over the wiring 212 in the cross section F1-F2. The insulating layer 230 also functions as a spacer for maintaining a space that is to be filled with a liquid crystal. The insulating layer 230 may be formed of a resist or another insulator. The formation method may be a photolithography technique, a dispenser method, an ink jet method, or the like.

According to this embodiment, a liquid crystal display device can be manufactured through a smaller number of photolithography steps than the conventional number. Therefore, a liquid crystal display device can be manufactured at low cost with high productivity.

This embodiment can be freely combined with any of the other embodiments.

Embodiment 2

Figure 7A:
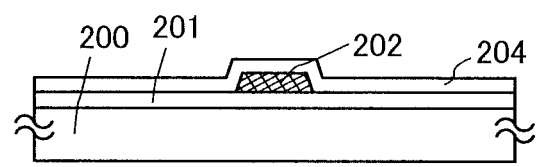
FIGS. 7A to 7C are cross-sectional views of one embodiment of the present invention.
Figure 7B:
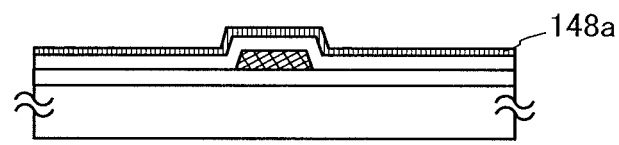
Figure 7C:
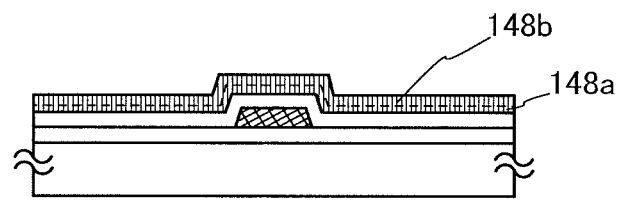

In this embodiment, an example of a process which is partially different from that described in Embodiment 1 will be described with reference to FIGS. 7A to 7C. Note that in FIGS. 7A to 7C, the same reference numerals are used for the same parts as those in Embodiment 1, and description of the parts with the same reference numerals will be omitted here.

First, in a manner similar to that of Embodiment 1, a conductive layer is formed over the substrate 200 having an insulating surface, and then, the gate electrode 202 is formed through a first photolithography step and an etching step.

An insulating layer serving as a base layer may be provided between the substrate 200 and the gate electrode 202. In this embodiment, the base layer 201 is provided. The base layer 201 has a function of preventing diffusion of an impurity element (such as Na) from the substrate 200, and can be formed using a film selected from a silicon oxide film, a silicon oxynitride film, a silicon nitride film, a hafnium oxide film, an aluminum oxide film, a gallium oxide film, or a gallium aluminum oxide film. The structure of the base layer is not limited to a single-layer structure, and may be a stacked structure of a plurality of the above films.

In this embodiment, because the film formation temperature of a semiconductor layer to be formed later is higher than or equal to 200° C. and lower than or equal to 450° C. and the temperature of heat treatment after the formation of the semiconductor layer is higher than or equal to 200° C. and lower than or equal to 450° C., the gate electrode 202 is formed of stacked layers of copper for a lower layer and molybdenum for an upper layer or stacked layers of copper for a lower layer and tungsten for an upper layer.

Then, the gate insulating layer 204 is formed over the gate electrode 202 by a CVD method, a sputtering method, or the like in a manner similar to that of Embodiment 1. The structure obtained through the process up to here is illustrated in the cross-sectional view of FIG. 7A.

Next, a first oxide semiconductor layer is formed to a thickness greater than or equal to 1 nm and less than or equal to 10 nm over the gate insulating layer 204. In this embodiment, the first oxide semiconductor layer is formed to a thickness of 5 nm in an oxygen atmosphere, an argon atmosphere, or a mixed atmosphere of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, a first crystalline oxide semiconductor layer 148a is formed (see FIG. 7B).

Next, a second oxide semiconductor layer with a thickness more than 10 nm is formed over the first crystalline oxide semiconductor layer 148a. In this embodiment, the second oxide semiconductor layer is formed to a thickness of 25 nm in an oxygen atmosphere, an argon atmosphere, or a mixed atmosphere of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used; the distance between the substrate and the target is 170 mm; the substrate temperature is 400° C.; the pressure is 0.4 Pa; and the direct current (DC) power is 0.5 kW.

Then, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, a second crystalline oxide semiconductor layer 148b is formed (see FIG. 7C).

The following process is similar to that of Embodiment 1, that is, the source electrode 206a, the drain electrode 206b, the insulating layer 207, and the like are formed; and the insulating layer 207, the first crystalline oxide semiconductor layer 148a, and the second crystalline oxide semiconductor layer 148b are etched using the same resist mask, by which the number of photolithography steps is reduced.

Thus, in accordance with Embodiment 1, the transistor 111 can be obtained. Note that in the case of using this embodiment, the stacked layers of the first crystalline oxide semiconductor layer 148a and the second crystalline oxide semiconductor layer 148b form a semiconductor layer including a channel formation region of the transistor. The first crystalline oxide semiconductor layer 148a and the second crystalline oxide semiconductor layer 148b have c-axis alignment. Note that the first crystalline oxide semiconductor layer 148a and the second crystalline oxide semiconductor layer 148b comprise an oxide including a crystal with c-axis alignment (also referred to as C-Axis Aligned Crystal (in this specification, referred to as CAAC)), which has neither a single crystal structure nor an amorphous structure. The first crystalline oxide semiconductor layer 148a and the second crystalline oxide semiconductor layer 148b partly include a crystal grain boundary. The CAAC can be obtained by forming hexagonal crystals in an initial stage of deposition of an oxide semiconductor film and by causing crystal growth from the hexagonal crystals as a seed crystal. The substrate heating temperature at the time of forming the CAAC oxide semiconductor film is 100° C. to 500° C., preferably 200° C. to 400° C., and further preferably 250° C. to 300° C. In addition to this, the deposited oxide semiconductor film is subjected to heat treatment at a temperature higher than the substrate heating temperature at the deposition. By this heat treatment, microdefects in the film and defects at the interface of a stacked layer can be compensated.

In the case of the transistor including stacked layers of a first crystalline oxide semiconductor layer and a second crystalline oxide semiconductor layer, the amount of change in threshold voltage of the transistor between before and after being irradiated with light or being subjected to a bias-temperature (BT) stress test can be reduced; thus, such a transistor has stable electrical characteristics.

This embodiment can be freely combined with any of the other embodiments.

Embodiment 3

One mode of a display device in which any of the transistors described in Embodiment 1 and Embodiment 2 is used is illustrated in FIGS. 8A and 8B.

FIG. 8A is a plan view of a panel in which a transistor 4010 and a liquid crystal element 4013 are sealed between a first substrate 4001 and a second substrate 4006 with a sealant 4005. FIG. 8B is a cross-sectional view taken along line M-N in FIG. 8A and line F1-F2 in FIG. 1A.

The sealant 4005 is provided so as to surround a pixel portion 4002 provided over the first substrate 4001. The second substrate 4006 is provided over the pixel portion 4002. Accordingly, the pixel portion 4002 is sealed together with a liquid crystal layer 4008 by the first substrate 4001, the sealant 4005, and the second substrate 4006.

Further, an input terminal 4020 is provided in a region other than a region surrounded by the sealant 4005 over the first substrate 4001, and flexible printed circuits (FPCs) 4018a and 4018b are connected to the input terminal 4020. The FPC 4018a is electrically connected to a signal line driver circuit 4003 which is separately provided over another substrate, and the FPC 4018b is electrically connected to a scan line driver circuit 4004 which is separately provided over another substrate. Various signals and potentials supplied to the pixel portion 4002 are supplied from the signal line driver circuit 4003 and the scan line driver circuit 4004 via the FPCs 4018a and FPC 4018b.

Note that a connection method of separately formed driver circuits is not particularly limited, and a chip on glass (COG) method, a wire bonding method, a tape carrier package (TCP) method, a tape automated bonding (TAB) method, or the like can be used.

As a display element provided in the display device, a liquid crystal element (also referred to as a liquid crystal display element) can be used. Furthermore, a display medium whose contrast is changed by an electric effect, such as electronic ink, can be used.

The display device illustrated in FIGS. 8A and 8B includes an electrode 4015 and a wiring 4016. The electrode 4015 and the wiring 4016 are electrically connected to a terminal included in the FPC 4018 via an anisotropic conductive layer 4019.

The electrode 4015 is formed using the same conductive layer as a first electrode 4030, and the wiring 4016 is formed using the same conductive layer as a source and a drain electrode of the transistor 4010.

Any of the transistors described in Embodiment 1 and Embodiment 2 can be applied to the transistor 4010 in this embodiment. The transistor 4010 provided in the pixel portion 4002 is electrically connected to a display element to form a display panel. A variety of display elements can be used for the display element as long as display can be performed.

FIGS. 8A and 8B illustrate an example of a display device in which a liquid crystal element is used as a display element. In FIGS. 8A and 8B, the liquid crystal element 4013 which is a display element includes the first electrode 4030, a second electrode 4031, and the liquid crystal layer 4008. Note that insulating layers 4032 and 4033 serving as alignment films are provided so that the liquid crystal layer 4008 is interposed therebetween. The second electrode 4031 is formed on the second substrate 4006 side. The first electrode 4030 and the second electrode 4031 are stacked with the liquid crystal layer 4008 provided therebetween.

The insulating layer 230 illustrated in FIGS. 1A and 1B is provided to control the thickness (cell gap) of the liquid crystal layer 4008. An insulating layer 4035 in FIG. 8B corresponds to the insulating layer 230. The shape of the insulating layer 230 is not particularly limited as long as it can protect the gate wiring and control the cell gap. For example, the shape may be a cylinder shape, a prism shape, a spherical shape, or a barrel shape.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and rubbing treatment is also unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ Ω·cm or more, preferably $1 \times 10^{11}$ Ω·cm or more, further preferably $1 \times 10^{12}$ Ω·cm or more. The value of the specific resistivity in this specification is measured at 20° C.

The size of storage capacitor provided in the liquid crystal display device is set considering the leakage current of the transistor provided in the pixel portion or the like so that charge can be held for a predetermined period. By using the transistor in which a purified oxide semiconductor is used for a semiconductor layer including a channel region, it is enough to provide a storage capacitor having capacitance that is less than or equal to ⅓, preferably less than or equal to ⅕ of liquid crystal capacitance of each pixel.

In the transistor used in this embodiment, including a purified oxide semiconductor layer, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption. In addition, in the transistor including a purified oxide semiconductor layer, a potential applied to the liquid crystal element can be held even when a storage capacitor is not provided.

The field-effect mobility of the transistor including a purified oxide semiconductor layer used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors of R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. However, one embodiment of the present invention is not limited to a liquid crystal display device for color display and can be applied to a liquid crystal display device for monochrome display.

In FIGS. 8A and 8B, a flexible substrate as well as a glass substrate can be used as any of the first substrate 4001 and the second substrate 4006. For example, a light-transmitting plastic substrate or the like can be used. As plastic, a fiber-glass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The liquid crystal display device displays an image by transmitting light from a light source or a display element. Therefore, the substrate and the thin films such as the insulating layer and the conductive layer provided in the pixel portion where light passes have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added. Alternatively, a material formed of one to ten graphene sheets may be used.

One of the first electrode 4030 and the second electrode 4031 can be formed using one or plural kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition including a conductive high molecule (also referred to as a conductive polymer) can be used for the first electrode 4030 and the second electrode 4031. As the conductive high molecule, a so-called $\pi$-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, since a transistor is easily broken by static electricity or the like, a protection circuit is preferably provided. The protection circuit is preferably formed using a non-linear element.

As described above, by using any of the transistors described in Embodiment 1 and Embodiment 2, a liquid crystal display device with high reliability can be provided. Note that the transistors described in Embodiment 1 and Embodiment 2 can be applied to not only semiconductor devices having the display functions described above but also semiconductor devices having a variety of functions, such as a power device which is mounted on a power supply circuit, a semiconductor integrated circuit such as LSI, and a semiconductor device having an image sensor function of reading information of an object.

This embodiment can be freely combined with any of the other embodiments

Embodiment 4

In this embodiment, with the use of a display device which switches between an image for a left eye and an image for a right eye at high speed, an example in which a 3D image that is a moving image or a still image is seen with dedicated glasses with which videos of the display device are synchronized will be described with reference to FIGS. 9A and 9B. As the display device, the liquid crystal display device described in Embodiment 1 is used for example. As described in one embodiment of the present invention, it is favorable for a display device for displaying 3D image to employ an oxide semiconductor in a semiconductor layer because high-speed display driving can be realized.

Figure 9A:
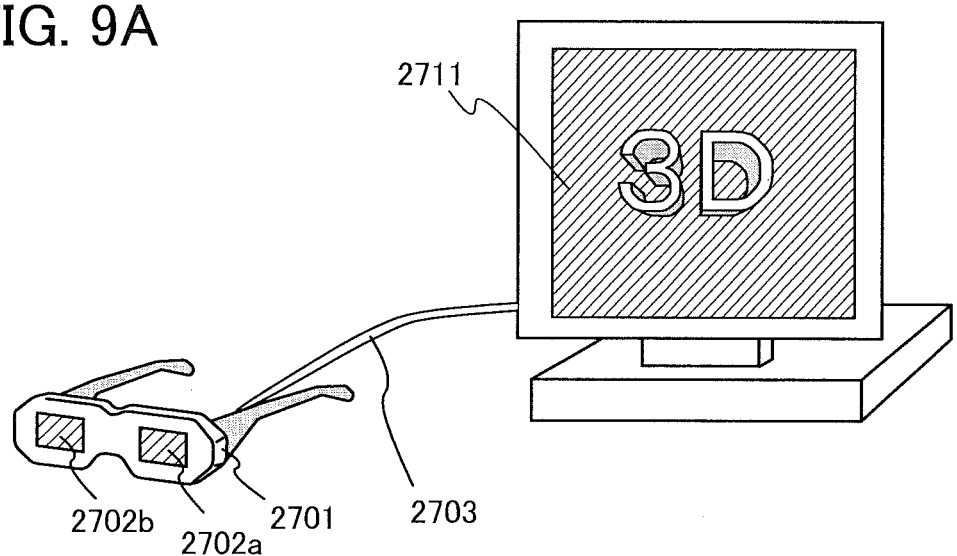
FIGS. 9A and 9B are views of one embodiment of the present invention.

FIG. 9A illustrates an external view in which a display device 2711 and dedicated glasses 2701 are connected to each other with a cable 2703. In the dedicated glasses 2701, shutters provided in a panel 2702*a* for a left eye and a panel 2702*b* for a right eye are alternately opened and closed, whereby a user can see an image of the display device 2711 as a 3D image.

Figure 9B:
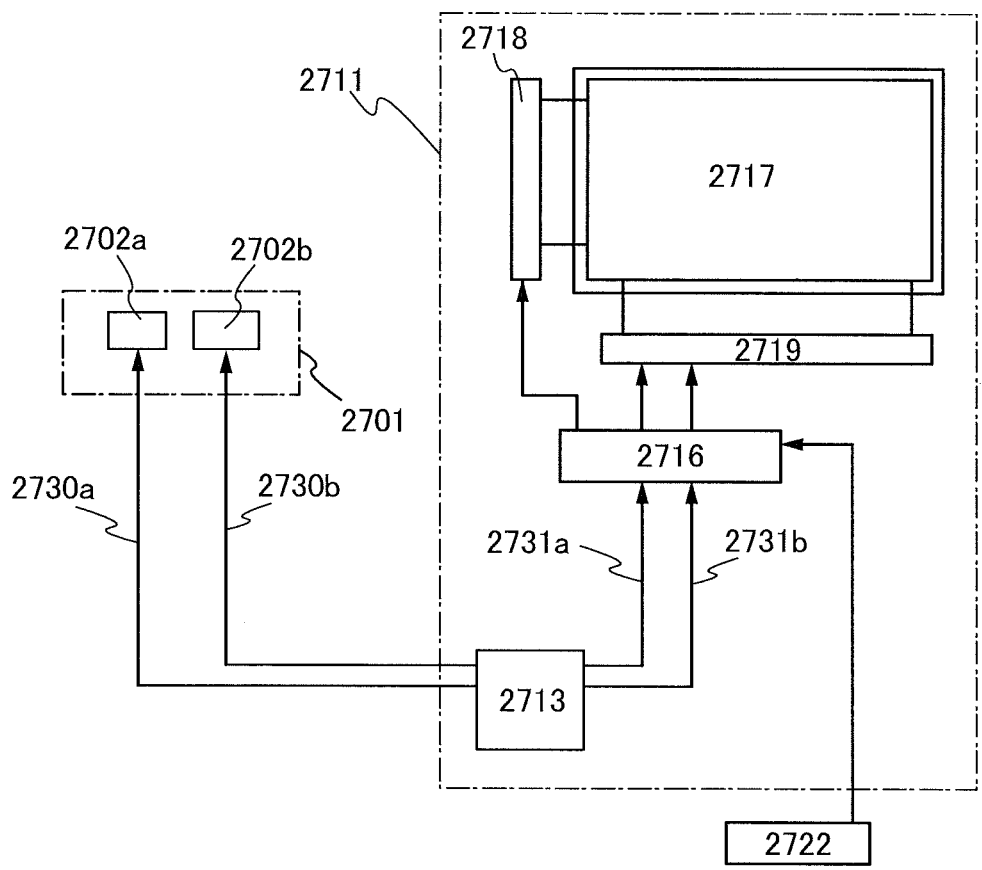

In addition, FIG. 9B is a block diagram illustrating a main structure of the display device 2711 and the dedicated glasses 2701.

The display device 2711 illustrated in FIG. 9B includes a display control circuit 2716, a display portion 2717, a timing generator 2713, a source line driver circuit 2718, an external operation unit 2722, and a gate line driver circuit 2719. Note that an output signal changes in accordance with operation by the external operation unit 2722 such as a keyboard.

In the timing generator 2713, a start pulse signal and the like are formed, and a signal for synchronizing an image for a left eye and the shutter of the panel 2702*a* for a left eye, a signal for synchronizing an image for a right eye and the shutter of the panel 2702*b* for a right eye, and the like are generated.

A synchronization signal 2731*a* of the image for a left eye is input to the display control circuit 2716, so that the image for a left eye is displayed on the display portion 2717. At the same time, a synchronization signal 2730*a* for opening the shutter of the panel 2702*a* for a left eye is input to the panel 2702*a* for a left eye. In addition, a synchronization signal 2731*b* of the image for a right eye is input to the display control circuit 2716, so that the image for a right eye is displayed on the display portion 2717. At the same time, a synchronization signal 2730*b* for opening the shutter of the panel 2702*b* for a right eye is input to the panel 2702*b* for a right eye.

Since switching between an image for a left eye and an image for a right eye is performed at high speed, the display device 2711 preferably employs a successive color mixing method (a field sequential method) in which color display is performed by time division with use of light-emitting diodes (LEDs).

Further, since a field sequential method is employed, it is preferable that the timing generator 2713 input signals that synchronize with the synchronization signals 2730*a* and 2730*b* to the backlight portion of the light-emitting diodes. Note that the backlight portion includes LEDs of R, G, and B colors.

This embodiment can be freely combined with any of the other embodiments in this specification.

Embodiment 5

In this embodiment, examples of electronic appliances each including the display device described in the above embodiment will be described.

Figure 10A:
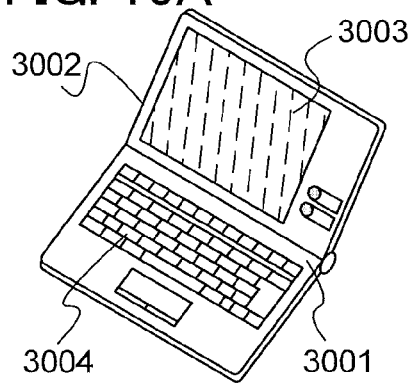
FIGS. 10A to 10F illustrate examples of usage mode of an electronic appliance.

FIG. 10A illustrates a laptop personal computer, which includes a main body 3001, a housing 3002, a display portion 3003, a keyboard 3004, and the like. By using the liquid crystal display device described in the above embodiment, a highly reliable laptop personal computer can be obtained.

Figure 10B:
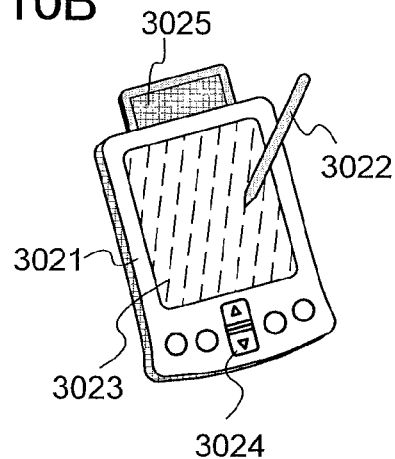

FIG. 10B is a personal digital assistant (PDA) which includes a main body 3021 provided with a display portion 3023, an external interface 3025, operation buttons 3024, and the like. A stylus 3022 is included as an accessory for operation. By using the liquid crystal display device described in the above embodiment, a highly reliable personal digital assistant (PDA) can be obtained.

Figure 10C:
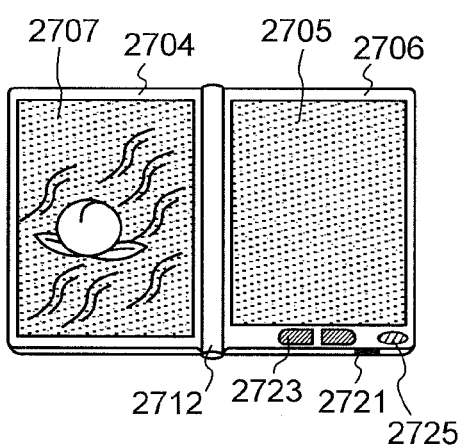

FIG. 10C illustrates an example of an e-book reader. For example, the e-book reader includes two housings, a housing 2706 and a housing 2704. The housing 2706 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2706 and the housing 2704, respectively. The display portion 2705 and the display portion 2707 may display a continuous image or different images. In the structure where different images are displayed on different display portions, for example, the right display portion (the display portion 2705 in FIG. 10C) displays text and the left display portion (the display portion 2707 in FIG. 10C) displays graphics. By using the liquid crystal display device described in the above embodiment, a highly reliable e-book reader can be obtained.

FIG. 10C illustrates an example in which the housing 2706 is provided with an operation portion and the like. For example, the housing 2706 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 10D:
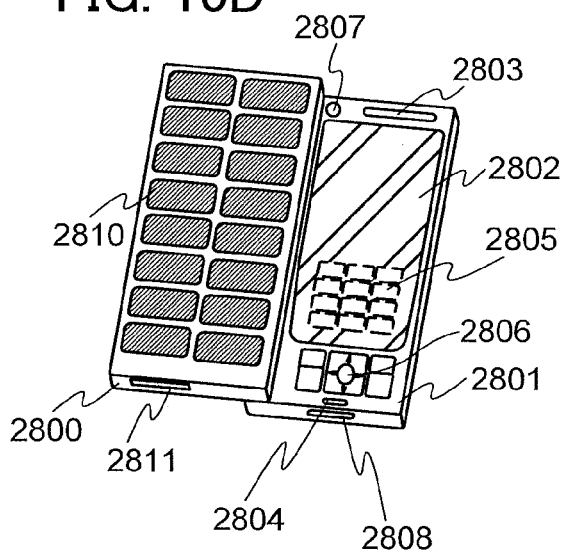

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801.

The display panel 2802 is provided with a touch screen. A plurality of operation keys 2805 which is displayed as images is illustrated by dashed lines in FIG. 10D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 10D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the liquid crystal display device described in the above embodiment, a highly reliable mobile phone can be provided.

Figure 10E:
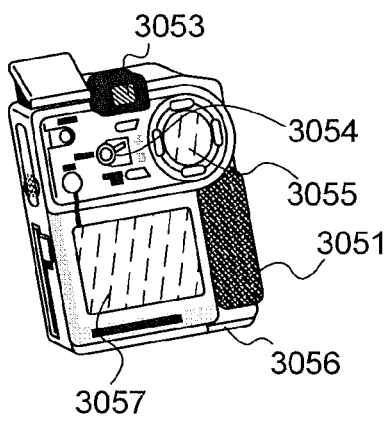

FIG. 10E illustrates a digital video camera which includes a main body 3051, a display portion A 3057, an eyepiece 3053, an operation switch 3054, a display portion B 3055, a battery 3056, and the like. By using the liquid crystal display device described in the above embodiment, a highly reliable digital video camera can be provided.

Figure 10F:
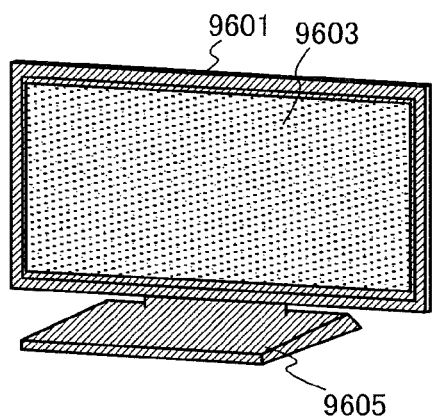

FIG. 10F illustrates an example of a television set. In the television set, a display portion 9603 is incorporated in a housing 9601. The display portion 9603 can display images. Here, the housing 9601 is supported by a stand 9605. By using the liquid crystal display device described in the above embodiment, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

Embodiment 6

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface, and in which metal atoms are arranged in a layered manner, or metal atoms and oxygen atoms are arranged in a layered manner along the c-axis, and the direction of the a-axis or the b-axis is varied in the a-b plane (the crystal rotates around the c-axis) will be described.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clearly determined in some cases.

Nitrogen may be substituted for part of oxygen included in the CAAC. The c-axes of individual crystalline portions included in the CAAC may be aligned in a certain direction (e.g., a direction perpendicular to a surface of a substrate over which the CAAC is formed or a surface of the CAAC). Alternatively, the normals of the a-b planes of the individual crystalline portions included in the CAAC may be aligned in a certain direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 13A:
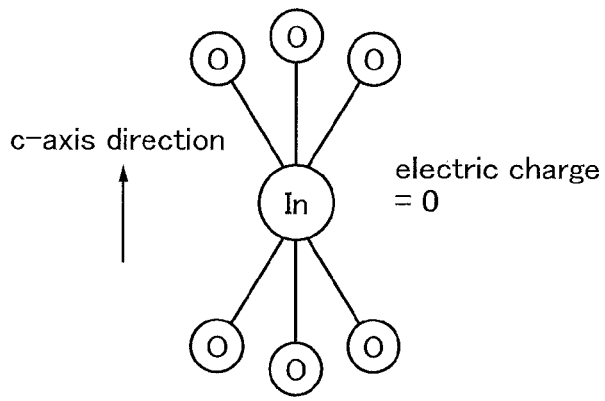
FIGS. 13A to 13E illustrate a crystal structure of an oxide material.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
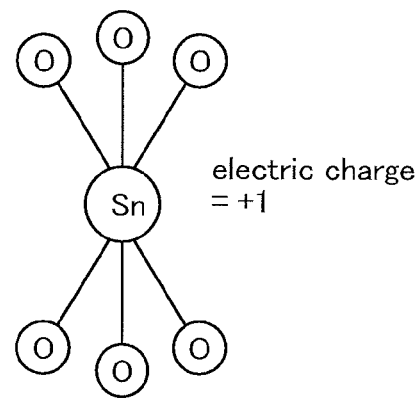
Figure 13B:
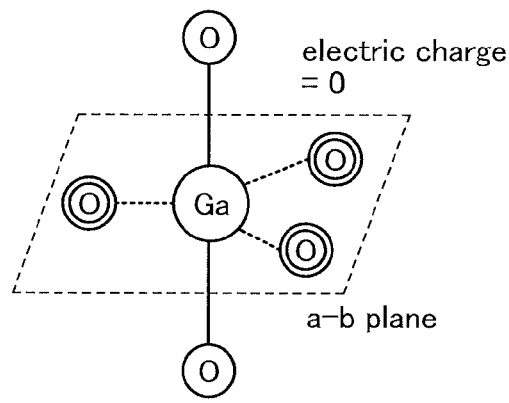

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
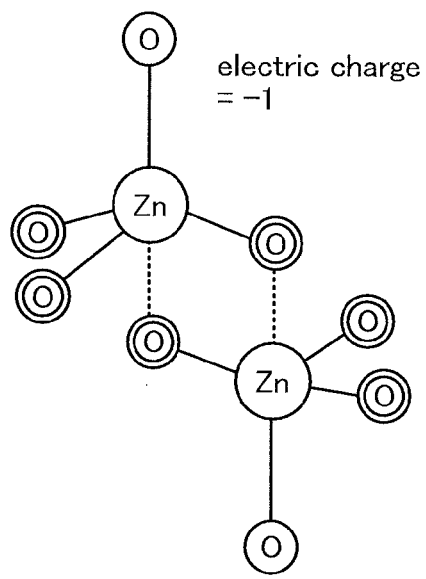
Figure 13C:
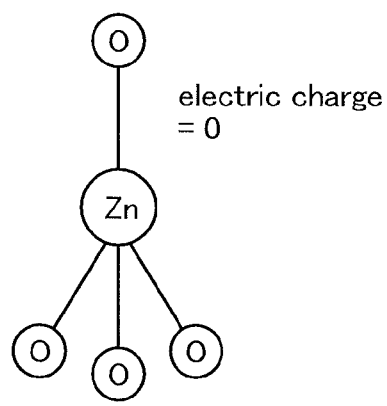

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom in FIG. 13B has one proximate Ga atom in the downward direction, and the one O atom in the lower half has one proximate Ga atom in the upward direction. The one O atom in the upper half with respect to the tetracoordinate Zn atom in FIG. 13C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 14A:
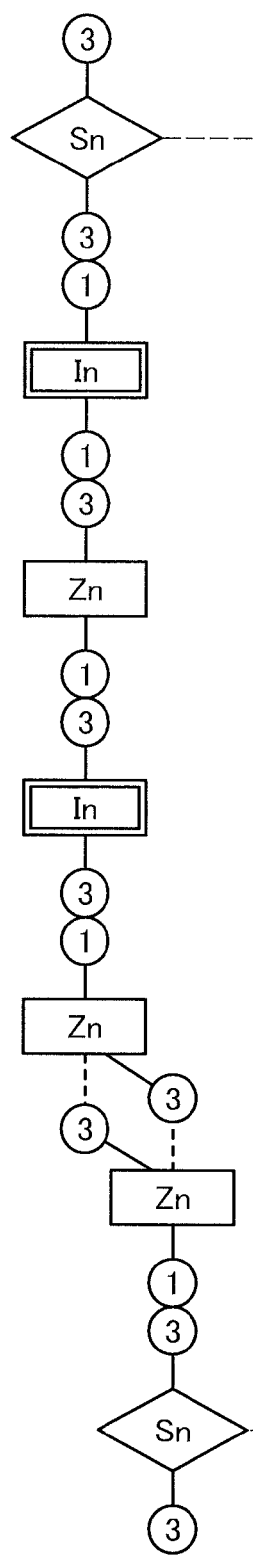
FIGS. 14A to 14C illustrate a crystal structure of an oxide material.
Figure 14B:
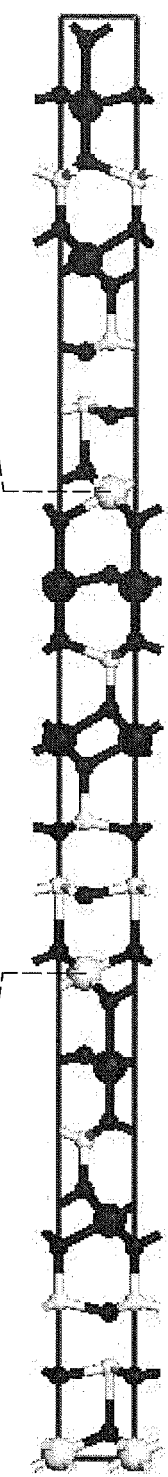
Figure 14C:
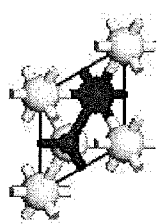

FIG. 14A illustrates a model of a medium group included in a layered structure of an In—Sn—Zn-based oxide. FIG. 14B illustrates a large group including three medium groups. Note that FIG. 14C illustrates an atomic arrangement in the case where the layered structure in FIG. 14B is observed from the c-axis direction.

In FIG. 14A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is framed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn-based oxide crystal ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—ZN-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 15A:
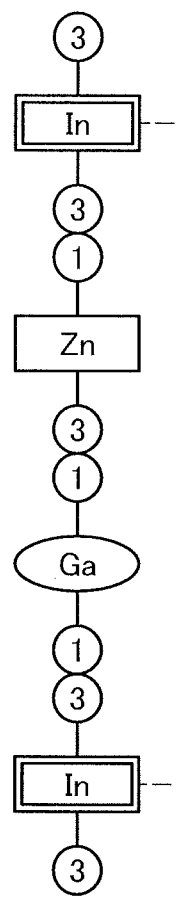
FIGS. 15A to 15C illustrate a crystal structure of an oxide material.

As an example, FIG. 15A illustrates a model of a medium group included in a layered structure of an In—Ga—Zn-based oxide.

In the medium group included in the layered structure of the In—Ga—Zn-based oxide in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 15B:
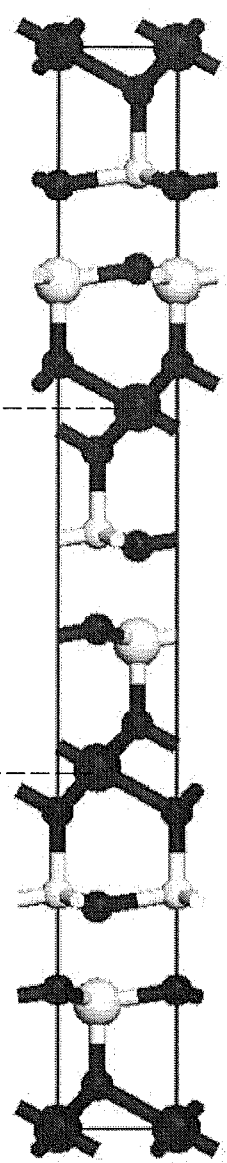
Figure 15C:
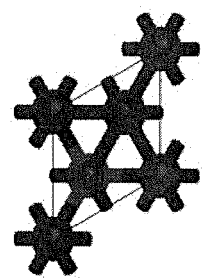

FIG. 15B illustrates a large group including three medium groups. Note that FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 15A but also a medium group in which the arrangement of the In atom, the Ga atom, and the Zn atom is different from that in FIG. 15A.

When the large group illustrated in FIG. 15B is repeated, a crystal of an In—Ga—Zn-based oxide can be obtained. Note that a layered structure of the obtained In—Ga—Zn-based crystal can be expressed as a composition formula, $InGaO_3(ZnO)_n$ (n is a natural number).

Figure 16A:
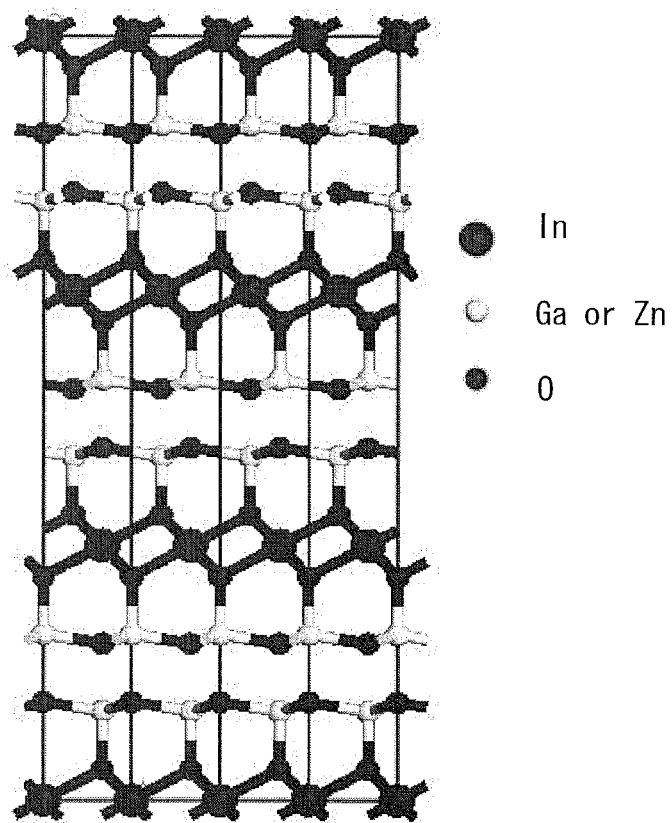
FIGS. 16A and 16B illustrate crystal structures of oxide materials.

In the case where n=1 ($InGaZnO_4$), a crystal structure illustrated in FIG. 16A can be obtained, for example. Note that in the crystal structure in FIG. 16A, since a Ga atom and an In atom each have five ligands as illustrated in FIG. 13B, a structure in which Ga is replaced with In can be obtained.

Figure 16B:
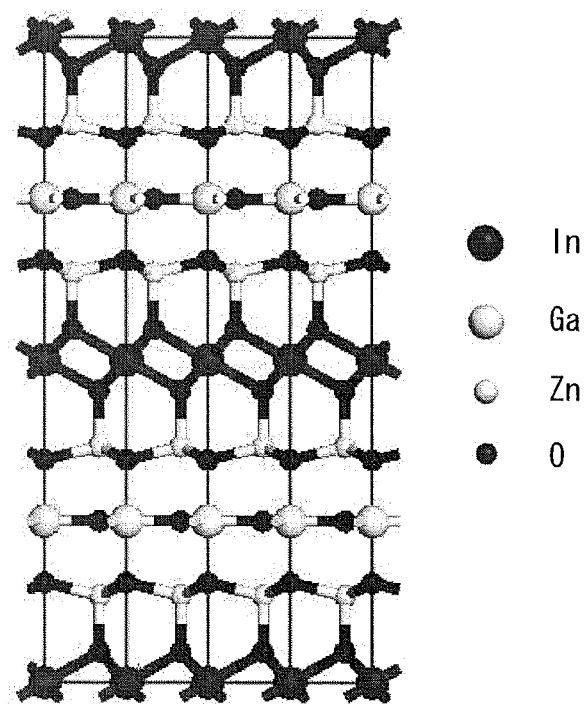

In the case where n=2 ($InGaZn_2O_5$), a crystal structure illustrated in FIG. 16B can be obtained, for example. Note that in the crystal structure in FIG. 16B, since a Ga atom and an In atom each have five ligands as described in FIG. 13B, a structure in which Ga is replaced with In can be obtained.

This embodiment can be implemented in appropriate combination with any of the structures described in the other embodiments.

This application is based on Japanese Patent Application serial no. 2010-204599 filed with Japan Patent Office on Sep. 13, 2010, the entire contents of which are hereby incorporated by reference.

What is claimed is:

1. A manufacturing method of a liquid crystal display device, comprising:
    forming a plurality of transistors, the formation of the plurality of transistors comprising:
        forming gate electrodes and a gate wiring over a substrate by a first photolithography step;
        forming a gate insulating layer over the gate electrodes;
        forming a semiconductor layer over the gate insulating layer; and
        forming source electrodes and drain electrodes over the semiconductor layer by a second photolithography step;
    forming a first insulating layer over the source electrodes and the drain electrodes;
    forming contact holes by selectively removing first parts of the first insulating layer wherein the first parts overlap with the drain electrodes, and removing a second part of the first insulating layer, a third part of the semiconductor layer, and a fourth part of the gate insulating layer wherein each of the second part, the third part, and the fourth part overlaps with neither the source electrodes nor the drain electrodes, by a third photolithography step, wherein the third photolithography step comprises a step of exposing a part of the gate wiring positioned between the plurality of transistors to divide the semiconductor layer;
    forming pixel electrodes over the first insulating layer by a fourth photolithography step, wherein the fourth photolithography step is performed so that the pixel electrodes are electrically disconnected from the exposed gate wiring; and
    forming, over the exposed gate wiring, a second insulating layer serving as a spacer maintaining a space that is to be filled with a liquid crystal.

2. The manufacturing method of a liquid crystal display device according to claim 1, further comprising:
    forming a base layer between the substrate and the gate electrodes.

3. The manufacturing method of a liquid crystal display device according to claim 1, wherein the semiconductor layer includes an oxide semiconductor.

4. The manufacturing method of a liquid crystal display device according to claim 1, wherein at least one of the gate electrodes, the gate wiring, the source electrodes, and the drain electrodes comprises a material containing copper.

5. The manufacturing method of a liquid crystal display device according to claim 4, wherein a maximum process temperature after the formation of the gate electrodes, the gate wiring, the source electrodes, or the drain electrodes is 450° C. or lower.

6. The manufacturing method of a liquid crystal display device according to claim 1, wherein at least one of the gate electrodes, the gate wiring, the source electrodes, and the drain electrodes comprises a material containing aluminum.

7. The manufacturing method of a liquid crystal display device according to claim 6, wherein a maximum process temperature after the formation of the gate electrodes, the gate wiring, the source electrodes, or the drain electrodes is 380° C. or lower.

8. A manufacturing method of a liquid crystal display device, comprising:
    forming a conductive layer;
    forming a first insulating layer over the conductive layer;
    forming a semiconductor layer over the first insulating layer;
    forming a first electrode and a second electrode over the semiconductor layer;
    forming a second insulating layer over the first electrode and the second electrode;
    removing a first part of the second insulating layer, a second part of the second insulating layer, a third part of the semiconductor layer, and a fourth part of the first insulating layer, so as to form a contact hole at the first part, and to expose a part of the conductive layer;
    forming a pixel electrode over the second insulating layer so as to be electrically disconnected from the exposed part of the conductive layer, and to be electrically connected to the first electrode through the contact hole; and
    forming a third insulating layer that overlaps with the exposed part of the conductive layer.

9. The manufacturing method of a liquid crystal display device according to claim 8, further comprising:
    forming a base layer under the conductive layer.

10. The manufacturing method of a liquid crystal display device according to claim 8, wherein the semiconductor layer includes an oxide semiconductor.

11. The manufacturing method of a liquid crystal display device according to claim 8, wherein at least one of the conductive layer, the first electrode, and the second electrode comprises a material containing copper.

12. The manufacturing method of a liquid crystal display device according to claim 11, wherein a maximum process temperature after the formation of the first electrode and the second electrode is 450° C. or lower.

13. The manufacturing method of a liquid crystal display device according to claim 8, wherein at least one of the conductive layer, the first electrode, and the second electrode comprises a material containing aluminum.

14. The manufacturing method of a liquid crystal display device according to claim 13, wherein a maximum process temperature after the formation of the first electrode and the second electrode is 380° C. or lower.

15. A manufacturing method of a liquid crystal display device, comprising:
- forming a conductive layer;
- forming a first insulating layer over the conductive layer;
- forming a semiconductor layer over the first insulating layer;
- forming a first electrode and a second electrode over the semiconductor layer;
- forming a second insulating layer over the first electrode and the second electrode;
- removing a first part of the second insulating layer, a second part of the second insulating layer, a third part of the semiconductor layer, and a fourth part of the first insulating layer, so as to form a contact hole at the first part, and to expose a part of the conductive layer;
- forming a pixel electrode over the second insulating layer so as to be electrically disconnected from the exposed part of the conductive layer, to be electrically connected to the first electrode through the contact hole, and so as not to overlap with a channel formation region of the semiconductor layer; and
- forming a third insulating layer that overlaps with the exposed part of the conductive layer.

16. The manufacturing method of a liquid crystal display device according to claim 15, further comprising:
- forming a base layer under the conductive layer.

17. The manufacturing method of a liquid crystal display device according to claim 15, wherein the semiconductor layer includes an oxide semiconductor.

18. The manufacturing method of a liquid crystal display device according to claim 15, wherein at least one of the conductive layer, the first electrode, and the second electrode comprises a material containing copper.

19. The manufacturing method of a liquid crystal display device according to claim 18, wherein a maximum process temperature after the formation of the first electrode and the second electrode is 450° C. or lower.

20. The manufacturing method of a liquid crystal display device according to claim 15, wherein at least one of the conductive layer, the first electrode, and the second electrode comprises a material containing aluminum.

21. The manufacturing method of a liquid crystal display device according to claim 20, wherein a maximum process temperature after the formation of the first electrode and the second electrode is 380° C. or lower.

* * * * *

UNITED STATES PATENT AND TRADEMARK OFFICE
CERTIFICATE OF CORRECTION

| | | |
|---|---|---|
| PATENT NO. | : 8,546,161 B2 | Page 1 of 1 |
| APPLICATION NO. | : 13/226822 | |
| DATED | : October 1, 2013 | |
| INVENTOR(S) | : Shunpei Yamazaki et al. | |

It is certified that error appears in the above-identified patent and that said Letters Patent is hereby corrected as shown below:

In the Specification

Column 9, line 46, replace "foimed" with --formed--;

Column 12, line 54, replace "fainted" with --formed--;

Column 13, line 38, replace "foimula" with --formula--;

Column 14, line 52, after "1" replace "inn" with --nm--;

Column 14, line 53, after "3" replace "mm" with --nm--;

Column 18, line 17, replace "framed" with --formed--;

Column 32, line 5, replace "framed" with --formed--;

Column 32, line 38, replace "In-Tm-ZN" with --In-Tm-Zn--.

Signed and Sealed this
Eighteenth Day of March, 2014

Michelle K. Lee
*Deputy Director of the United States Patent and Trademark Office*